(12) United States Patent
Yang

(10) Patent No.: US 11,742,862 B2
(45) Date of Patent: Aug. 29, 2023

(54) DELAY LOCKED LOOP DEVICE AND METHOD FOR OPERATING THE SAME

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 100 days.

(21) Appl. No.: 17/445,949

(22) Filed: Aug. 25, 2021

(65) Prior Publication Data

US 2023/0068525 A1   Mar. 2, 2023

(51) Int. Cl.
*H03L 7/081*   (2006.01)
*H03L 7/08*    (2006.01)

(52) U.S. Cl.
CPC ................. *H03L 7/0818* (2013.01); *H03L 7/0805* (2013.01)

(58) Field of Classification Search
CPC .................. H03L 7/08; H03L 7/0805
See application file for complete search history.

(56) References Cited

U.S. PATENT DOCUMENTS

| | | | | |
|---|---|---|---|---|
| 5,771,264 A * | 6/1998 | Lane | ..................... | H03L 7/181 327/158 |
| 7,111,185 B2 * | 9/2006 | Gomm et al. | ............ | G11C 7/22 713/400 |
| 7,885,369 B2 * | 2/2011 | Beyer et al. | ........... | H03L 7/081 375/376 |
| 7,945,800 B2 * | 5/2011 | Gomm et al. | ........ | G11C 7/1072 713/400 |
| 8,035,431 B2 * | 10/2011 | Kim et al. | ........... | H03L 7/0814 327/158 |
| 8,436,685 B2 * | 5/2013 | Michiyoshi | ............. | H03L 7/00 327/156 |
| 8,503,256 B2 * | 8/2013 | Ko | ........................ | G11C 7/109 365/194 |
| 8,717,835 B2 * | 5/2014 | Ma et al. | ................ | G11C 7/222 327/158 |
| 10,224,938 B2 * | 3/2019 | Takahashi | ........... | H03L 7/0818 |
| 10,707,849 B2 * | 7/2020 | Ho | ........................ | G11C 7/222 |

(Continued)

FOREIGN PATENT DOCUMENTS

| | | |
|---|---|---|
| CN | 101741372 | 6/2010 |
| KR | 20140112663 A * | 9/2014 |

*Primary Examiner* — Adam D Houston
(74) *Attorney, Agent, or Firm* — CKC & Partners Co., LLC

(57) ABSTRACT

A method includes following operations: a delay line delaying a first clock signal by a delay time to generate an output signal; a controller delaying the output signal by a first time interval to generate a first signal; the controller delaying the first clock signal by a second time interval shorter than the first time interval to generate a second clock signal; and the controller controlling the delay line according to the first signal and the second clock signal to adjust the delay time. A delay locked loop device is also disclosed herein.

19 Claims, 21 Drawing Sheets

(56) References Cited

U.S. PATENT DOCUMENTS

| | | | |
|---|---|---|---|
| 2009/0153205 A1* | 6/2009 | Johnson | H03L 7/0816 327/158 |
| 2009/0256603 A1* | 10/2009 | Choi | H03L 7/0814 327/158 |
| 2010/0120389 A1* | 5/2010 | Blum | H03L 7/0805 455/208 |
| 2010/0141312 A1* | 6/2010 | Lee | H03L 7/0814 327/158 |
| 2010/0264968 A1* | 10/2010 | Ko et al. | H03L 7/0818 327/158 |
| 2011/0001525 A1* | 1/2011 | Chung | H03L 7/0816 327/158 |
| 2011/0234278 A1* | 9/2011 | Seo | H03L 7/0816 327/158 |
| 2012/0194241 A1* | 8/2012 | Shin | H03L 7/0816 327/158 |
| 2012/0293221 A1* | 11/2012 | Ma et al. | H03L 7/0816 327/156 |
| 2014/0055181 A1* | 2/2014 | Chaivipas et al. | H03L 7/16 327/156 |
| 2016/0105189 A1* | 4/2016 | Maeda et al. | H03L 7/095 327/276 |

* cited by examiner

700C

700D

| CONDITIONS OF SOUT2 | B1 | B2 | B3 | B4 |
|---|---|---|---|---|
| DELAYED OR MOVED AHEAD BY AN INTERVAL < 1/4 T31 | 0 | 0 | 0 | 0 |
| DELAYED BY 1/4 T31 | 0 | 0 | 0 | 1 |
| NOT OCCUR | 0 | 0 | 1 | 0 |
| DELAYED BY 1/2 T31 | 0 | 0 | 1 | 1 |
| NOT OCCUR | 0 | 1 | 0 | 0 |
| NOT OCCUR | 0 | 1 | 0 | 1 |
| NOT OCCUR | 0 | 1 | 1 | 0 |
| DELAYED BY 3/4 T31 | 0 | 1 | 1 | 1 |
| MOVED AHEAD BY 1/4 T31 | 1 | 0 | 0 | 0 |
| NOT OCCUR | 1 | 0 | 0 | 1 |
| NOT OCCUR | 1 | 0 | 1 | 0 |
| NOT OCCUR | 1 | 0 | 1 | 1 |
| MOVED AHEAD BY 1/2 T31 | 1 | 1 | 0 | 0 |
| NOT OCCUR | 1 | 1 | 0 | 1 |
| MOVED AHEAD BY 3/4 T31 | 1 | 1 | 1 | 0 |
| DELAYED BY T31 OR MOVED AHEAD BY T31 | 1 | 1 | 1 | 1 |

FIG. 7I

| CONDITIONS OF SOUT2 | B5 | B2 | B3 | B4 | A1 |
|---|---|---|---|---|---|
| DELAYED OR MOVED AHEAD BY AN INTERVAL < 1/4 T31 | 0 | 0 | 0 | 0 | 0 |
| DELAYED BY 1/4 T31 | 0 | 0 | 0 | 1 | 0 |
| NOT OCCUR | 0 | 0 | 1 | 0 | - |
| DELAYED BY 1/2 T31 | 0 | 0 | 1 | 1 | 0 |
| DELAYED BY (1+1/2) T31 | 0 | 1 | 0 | 0 | 1 |
| NOT OCCUR | 0 | 1 | 0 | 1 | - |
| DELAYED BY (1+1/4) T31 | 0 | 1 | 1 | 0 | 1 |
| DELAYED BY 3/4 T31 OR DELAYED BY T31 | 0 | 1 | 1 | 1 | 1 |
| MOVED AHEAD BY 1/4 T31 | 1 | 0 | 0 | 0 | 0 |
| MOVED AHEAD BY (1+3/4) T31 | 1 | 0 | 0 | 1 | 1 |
| NOT OCCUR | 1 | 0 | 1 | 0 | - |
| MOVED AHEAD BY (1+1/2) T31 | 1 | 0 | 1 | 1 | 1 |
| MOVED AHEAD BY 1/2 T31 | 1 | 1 | 0 | 0 | 0 |
| NOT OCCUR | 1 | 1 | 0 | 1 | - |
| MOVED AHEAD BY 3/4 T31 | 1 | 1 | 1 | 0 | 1 |
| MOVED AHEAD BY T31 OR MOVED AHEAD BY (1+1/4) T31 | 1 | 1 | 1 | 1 | 1 |

FIG. 11

DELAY LOCKED LOOP DEVICE AND METHOD FOR OPERATING THE SAME

BACKGROUND

Technical Field

The present disclosure relates to a delay locked loop device. More particularly, the present disclosure relates to a delay locked loop device and a method for operating the delay locked loop device.

Description of Related Art

A delay locked loop device is configured to delay a clock signal by a delay time to output a corresponding output signal. However, the delay locked loop device needs to receive an external voltage for operations, and when the external voltage is not stable, the delay time is affected and problems of latency jump may occur. Thus, techniques associated with the development for overcoming the problems described above are important issues in the field.

SUMMARY

The present disclosure provides a method. The method includes following operations: a delay line delaying a first clock signal by a delay time to generate an output signal; a controller delaying the output signal by a first time interval to generate a first signal; the controller delaying the first clock signal by a second time interval shorter than the first time interval to generate a second clock signal; and the controller controlling the delay line according to the first signal and the second clock signal to adjust the delay time.

The present disclosure also provides a delay locked loop device. The delay locked loop device includes a first delay line and a controller. The first delay line is configured to delay a first clock signal by a delay time to generate an output signal. The controller is configured to control the first delay line to adjust the delay time according to a plurality of bits. The controller includes a second delay line, a frequency divider and flip-flop circuits. The second delay line is configured to generate a second clock signal based on the first clock signal. The frequency divider is configured to generate a first signal according to the output signal, wherein a frequency of the first signal is lower than a frequency of the output signal. The flip-flop circuits are configured to generate the plurality of bits based on the first signal and the second clock signal.

The present disclosure also provides a method. The method includes following operations: a delay line delaying a first clock signal by a delay time to generate an output signal; a controller delaying the output signal by a first time interval to generate a first signal; the controller delaying the first clock signal by a second time interval being approximately an half of the first time interval to generate a second clock signal; the controller generating a second signal based on the first signal, wherein a frequency of the second signal is equal to or lower than a half of a frequency of the first signal, and an edge of the second signal and an edge of the first signal are positioned at a same moment; the controller delaying the first signal by the first time interval to generate a third signal; and the controller controlling the delay line according to a voltage level of the second signal and a voltage level of the third signal at a moment of an edge of the second clock signal, to adjust the delay time.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7I is a truth table of the bits corresponding to delaying and moving ahead conditions of the output signal illustrated according to some embodiments of this disclosure.

FIG. 11 is a truth table of the bits corresponding to delaying and moving ahead conditions of the output signal illustrated according to some embodiments of this disclosure.

DETAILED DESCRIPTION

Figure 1:
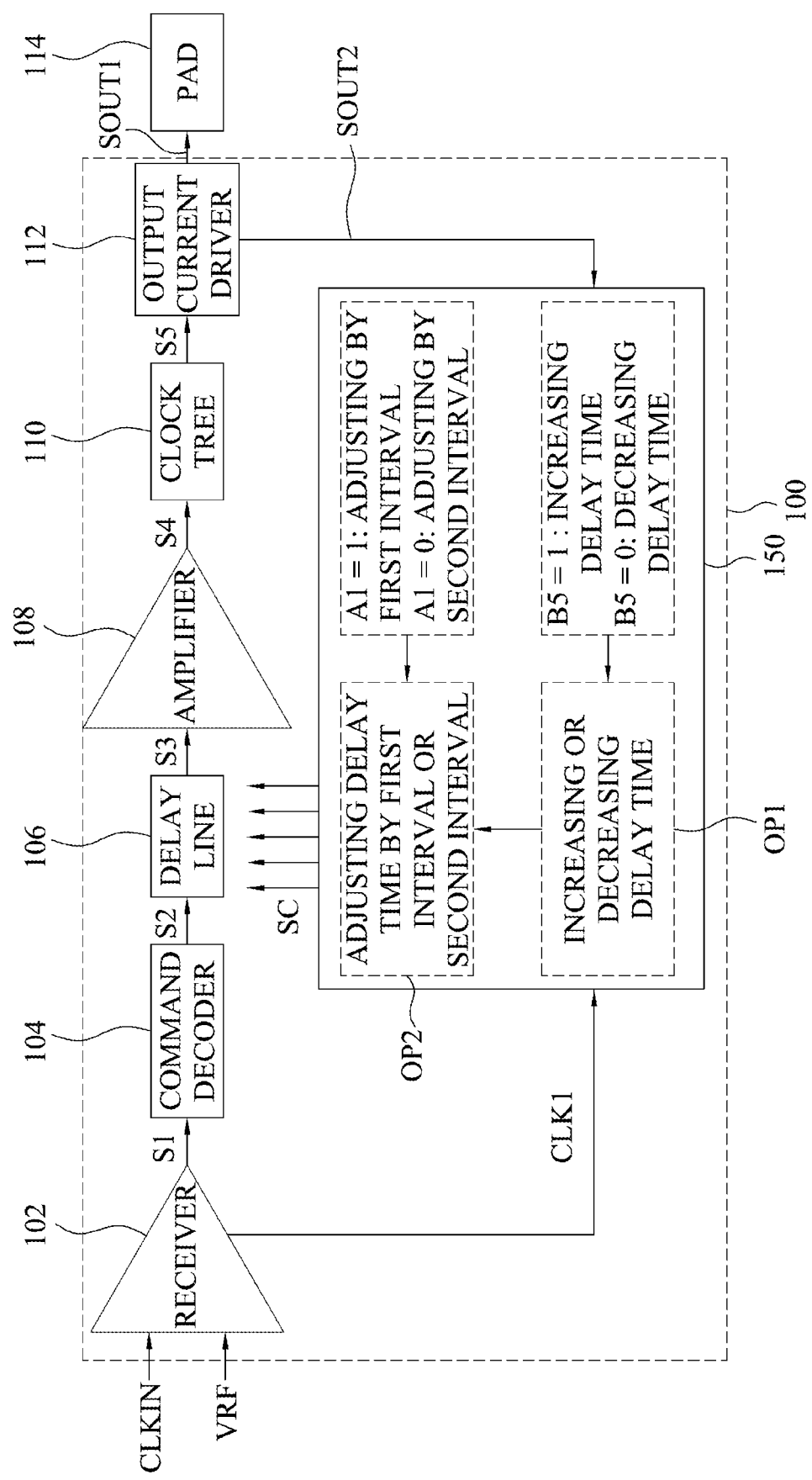
FIG. 1 is a schematic diagram of a delay locked loop device illustrated according to some embodiments of this disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic diagram of a delay locked loop device 100 illustrated according to some embodiments of this disclosure. As illustratively shown in FIG. 1, the delay locked loop device 100 is configured to generate an output signal SOUT1 according to a clock signal CLKIN, and output the output signal to a pad 114.

As illustratively shown in FIG. 1, the delay locked loop device 100 includes a receiver 102, a command decoder 104, a delay line 106, an amplifier 108, a clock tree 110, an output current driver 112 and a controller 150. The receiver 102 is configured to receive the clock signal CLKIN and a reference voltage VRF and generate a signal S1 and a clock signal CLK1. In some embodiments, waveforms of the signal S1 and a clock signal CLK1 are substantially equal to a waveform of the clock signal CLKIN. The command decoder 104 is configured to generate a signal S2 according to the signal S1. In some embodiments, a waveform of the signal S2 is substantially equal to the waveform of the signal S1. The delay line 106 is configured to delay the signal S2 to generate a signal S3. In other word, the signal S3 has a waveform similar to the waveform of the signal S2 but delayed by a time interval, in which the time interval is also referred to as a delay time of the delay locked loop device 100. The amplifier 108 is configured to amplify the signal S3 to generate a signal S4. The clock tree 110 is configured to perform calculations and generate a signal S5 according to the signal S4. In some embodiments, a waveform of the signal S5 is substantially equal to the waveform of the signal S4 or an amplified version of the signal S4. The output current driver 112 is configured to generate output signals SOUT1 and SOUT2 according to the signal S5. In some embodiments, a waveform of the output signals SOUT1 and SOUT2 are substantially equal to the waveform of the signal S5. The controller 150 is configured to generate control signals SC to control the delay line 106 according to the clock signal CLK1 and the output signal SOUT2.

As illustratively shown in FIG. 1, the controller 150 is configured to perform operations OP1 and OP2 according to the clock signal CLK1 and the output signal SOUT2. The operation OP1 determines a direction of adjusting the delay time induced by the delay line 106. The operation OP2 determines an amount of a time interval for adjusting the delay time. Further details of the operations OP1 and OP2 are described below with respect to embodiments associated with FIGS. 2, 3, 4, 8 and 10.

Figure 2:
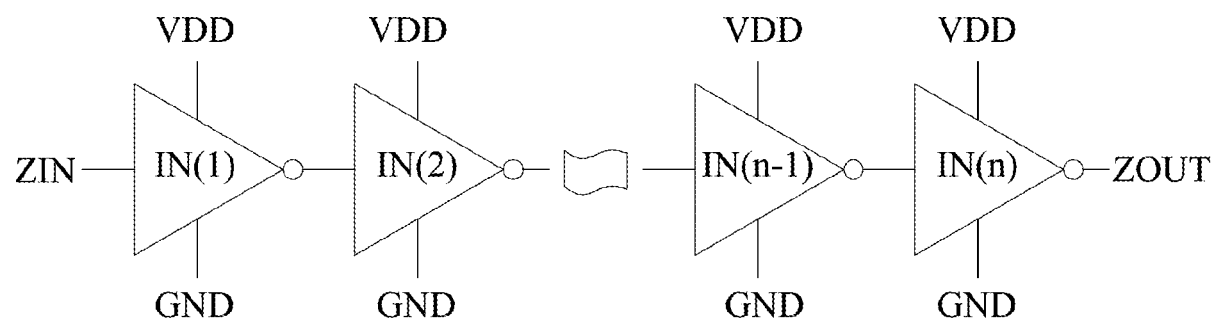
FIG. 2 is a schematic diagram of a delay line illustrated according to some embodiments of this disclosure.

FIG. 2 is a schematic diagram of a delay line 200 illustrated according to some embodiments of this disclosure. The delay line 200 is an embodiment of the delay line 106 shown in FIG. 1. In some embodiments, the delay line 200 is configured to delay a signal ZIN to generate a signal ZOUT. In other word, the signal ZOUT has a waveform similar to the waveform of the signal ZIN but delayed by a time interval, which also referred to as a delay time. In some embodiments, the signal ZIN corresponds to the signal S1, S2 and the clock signals CLKIN, CLK1. The signal ZOUT corresponds to the signals S3-S5 and the output signals SOUT1, SOUT2 shown in FIG. 1.

As illustratively shown in FIG. 2, the delay line 200 includes buffers IN(1)-IN(n), in which n is a positive integer. Each of the buffers IN(1)-IN(n) couples to a voltage VDD and a ground voltage GND. In some embodiments, the delay time between the signals ZIN and ZOUT is proportional to the number of the buffers IN(1)-IN(n). In some embodiments, the buffers IN(1)-IN(n) are implemented as inverters.

Referring to FIG. 1 and FIG. 2, the controller 150 is configured to control the number of the buffers IN(1)-IN(n) to increase or decrease the delay time between the signals ZIN and ZOUT. At the operation OP1, the controller 150 is configured to increase or decrease the delay time according to a bit B5. In some other embodiments, the controller 150 may increase or decrease the delay time according to a bit B1. Further details of the bits B1 and B5 are described below with respect to embodiments associated with FIG. 4 and FIG. 8.

In some embodiments, the delay time between the signals ZIN and ZOUT may be affected by a voltage level of the voltage VDD. For example, when the voltage level of the voltage VDD increase, the delay time decreases, and when the voltage level of the voltage VDD decrease, the delay time increases.

Figure 3:
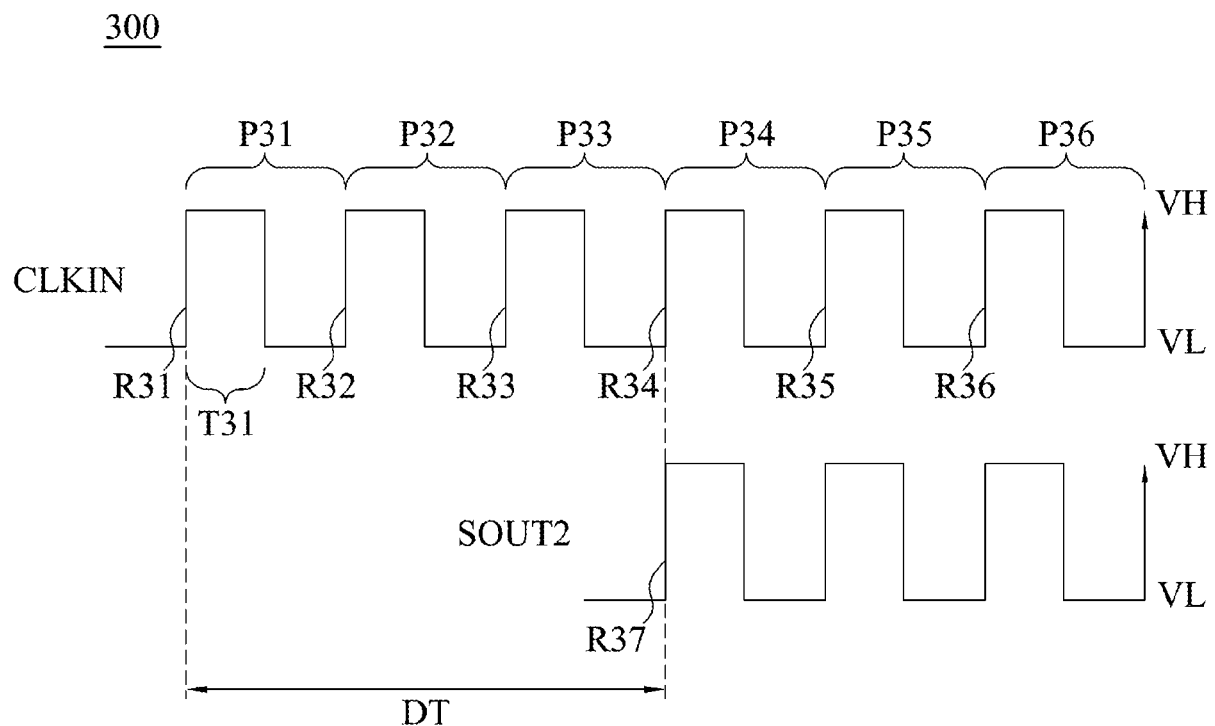
FIG. 3 is a timing diagram of the delay locked loop device performing operations illustrated according to some embodiments of this disclosure.

FIG. 3 is a timing diagram 300 of the delay locked loop device 100 performing operations illustrated according to some embodiments of this disclosure. As illustratively shown in FIG. 3, the timing diagram 300 includes six periods P31-P36. Each of the periods P31-P36 corresponds to one clock cycle of the clock signal CLKIN. Each of the periods P31-P36 has a time length of twice of a time interval T31. The clock signal CLKIN has rising edges R31-R36 corresponding to the periods P31-P36, respectively. The clock signal CLKIN is pulled to a voltage level VH at each of the rising edges R31-R36, and is pulled from the voltage level VH to a voltage level VL during each of the periods P31-P36.

Referring to FIG. 1 and FIG. 3, in the embodiment shown in FIG. 3, the delay locked loop device 100 delays the clock signal CLKIN by three clock cycles (for example, the periods P31-P33) to generate the output signal SOUT2. In other words, the waveform of the output signal SOUT2 is similar to the wave form of the clock signal CLKIN but delayed by a delay time DT of three clock cycles. Accordingly, the first rising edge R37 of the output signal SOUT2 corresponds to the first rising edge R31 of the clock signal CLKIN, and is aligned with the fourth rising edge R34 of the clock signal CLKIN.

Referring to FIG. 2 and FIG. 3, the rising edge R37 may not be aligned with the rising edge R34 when the voltage level of the voltage VDD changes. For example, when the voltage level of the voltage VDD increase, the delay time DT decreases and the waveform of the output signal SOUT2 being moved leftward and the rising edge R37 is at the left side of the rising edge R34, correspondingly. When the voltage level of the voltage VDD decrease, the delay time DT increases and the waveform of the output signal SOUT2 being moved rightward and the rising edge R37 is at the right side of the rising edge R34, correspondingly.

Referring to FIG. 1 and FIG. 3, when the rising edge R37 is not aligned with the rising edge R34, the controller 150 is configured to adjust the output signal SOUT2 to align the rising edge R37 with the rising edge R34.

For example, at the operation OP1, when the rising edge R37 is at the left side of the rising edge R34, the controller 150 generates the bit B5 having a logic value 1 indicating that the delay time DT of the output signal SOUT2 should be increased. Accordingly, the controller 150 increases the number of buffers IN(1)-IN(n) those configured to delay the clock signal CLKIN, such that the output signal SOUT2 is moved rightward until the rising edge R37 is aligned with the rising edge R34. Similarly, when the rising edge R37 is at the right side of the rising edge R34, the controller 150 generates the bit B5 having a logic value 0 indicating that the delay time DT of the output signal SOUT2 should be decreased. Accordingly, the controller 150 decreases the number of buffers IN(1)-IN(n) those configured to delay the clock signal CLKIN, such that the output signal SOUT2 is moved leftward until the rising edge R37 is aligned with the rising edge R34.

Referring to FIG. 1 and FIG. 3, the controller 150 is further configured to adjust a time interval for adjusting the delay time DT according to a bit A1. In some embodiment, the controller 150 adjusts the time interval for adjusting the delay time DT by adjust the number of buffers IN(1)-IN(n).

In some embodiment, in response to the rising edge R37 being biased from the rising edge R34 by a larger time interval, the controller 150 adjusts the delay time with a larger time interval, and in response to the rising edge R37 being biased from the rising edge R34 by a smaller time interval, the controller 150 adjusts the delay time with a smaller time interval.

For example, at the operation OP2, in response to the rising edge R37 being biased from the rising edge R34 by a time interval larger than or equal to three quarters of the time interval T31, the controller 150 generates the bit A1 having a logic value 1 indicating that the delay time of the output signal SOUT2 should be adjusted by the time interval T31. Accordingly, the controller 150 adjusts the number of buffers IN(1)-IN(n) by a number corresponding to the time interval T31 (for example, increasing or decreasing the number of buffers IN(1)-IN(n) by ten), such that the rising edge R37 is moved toward the direction of the rising edge R34 by the time interval T31. Similarly, in response to the rising edge R37 being biased from the rising edge R34 by a time interval smaller than three quarters of the time interval T31, the controller 150 generates the bit A1 having a logic value 0 indicating that the delay time of the output signal SOUT2 should be adjusted by one tenth of the time interval T31. Accordingly, the controller 150 adjusts the number of buffers IN(1)-IN(n) by a number corresponding to one tenth of the time interval T31 (for example, increasing or decreasing the number of buffers IN(1)-IN(n) by one), such that the rising edge R37 is moved toward the direction of the rising edge R34 by one tenth of the time interval T31.

In some previous approaches, in response to an output signal of a delay locked loop device being biased by a time interval larger than a half of a clock cycle of a clock signal, the delay locked loop device may adjust the rising edge of the output signal to a wrong rising edge of the clock signal. In above approaches, an amount of a time interval for adjusting a delay time of the output signal cannot be adjusted.

Compared to the above approaches, in some embodiments of the present disclosure, the controller 150 adjusts the rising edge R37 of the output signal SOUT2 to the corresponding rising edge R34 according to the bit B5, and adjusts the time interval for adjusting the delay time DT of the output signal SOUT2 according to the bit A1. Further details of the bit B5 and the bit A1 are described below.

Figure 4:
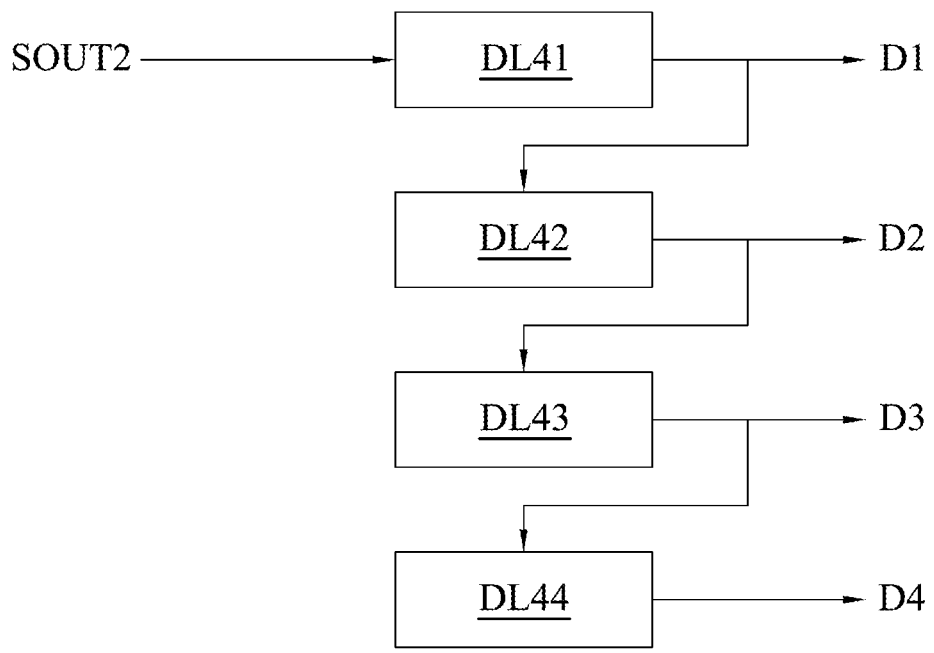
FIG. 4 is a schematic diagram of a controller illustrated according to some embodiments of this disclosure.

FIG. 4 is a schematic diagram of a controller 400 illustrated according to some embodiments of this disclosure. The controller 400 is an embodiment of the controller 150 shown in FIG. 1. In some embodiments, the controller 400 is configured to receive the output signal SOUT2 and generate signals D1-D4 according to the output signal SOUT2.

As illustratively shown in FIG. 4, the controller 400 includes delay lines DL41-DL44. The delay line DL41 is configured to delay the output signal SOUT2 by one fourth of the time interval T31 to generate the signal D1. The delay line DL42 is configured to delay the signal D1 by one fourth of the time interval T31 to generate the signal D2. The delay line DL43 is configured to delay the signal D2 by one fourth of the time interval T31 to generate the signal D3. The delay line DL44 is configured to delay the signal D3 by one fourth of the time interval T31 to generate the signal D4. In various embodiments, the controller 400 may include N delay lines, and each of the delay lines may receive a signal delayed by a former delay line by one Nth of the time interval T31, in which N is an integer larger than four.

Figure 5:
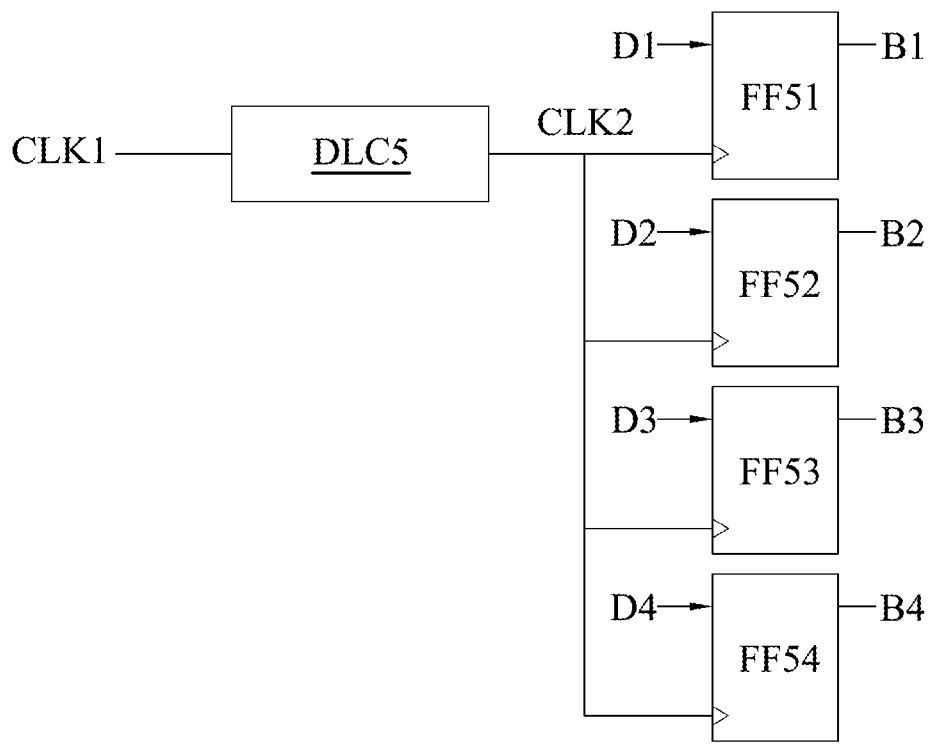
FIG. 5 is a schematic diagram of a controller illustrated according to some embodiments of this disclosure.

FIG. 5 is a schematic diagram of a controller 500 illustrated according to some embodiments of this disclosure. The controller 500 is an embodiment of the controller 150 shown in FIG. 1. In some embodiments, the controller 500 is configured to receive the clock signal CLK1 and the signals D1-D4, and configured to generate bits B1-B4 according to the clock signal CLK1 and the signals D1-D4. Referring to FIG. 1 and FIG. 5, the controller 500 is configured to control the delay line 106 according to the bits B1-B4. In some embodiments, the controller 500 includes the delay lines DL41-DL44 shown in FIG. 4.

As illustratively shown in FIG. 5, the controller 500 includes a delay line DLC5 and flip flop circuits FF51-FF54. The delay line DLC5 is configured to delay the clock signal CLK1 by one eighth of the time interval T31 to generate a clock signal CLK2. In various embodiments, the delay line DLC5 may delay the clock signal CLK1 by various time intervals shorter than the time interval of the delay line DL41 for delaying SOUT2. In some embodiments, the delay line DLC5 delays the clock signal CLK1 by a time interval being approximately a half of the time interval of the delay line DL41 for delaying SOUT2. For example, the delay line DLC5 delays the clock signal CLK1 by two seventeenth of the time interval T31 to generate the clock signal CLK2 in some embodiments.

As illustratively shown in FIG. 5, the flip flop circuit FF51 is configured to generate the bit B1 according to the clock signal CLK2 and the signal D1. The flip flop circuit FF52 is configured to generate the bit B2 according to the clock signal CLK2 and the signal D2. The flip flop circuit FF53 is configured to generate the bit B3 according to the clock signal CLK2 and the signal D3. The flip flop circuit FF54 is configured to generate the bit B4 according to the clock signal CLK2 and the signal D4. In some embodiments, the flip flop circuits FF51-FF54 are triggered by a rising edge of the clock signal CLK2.

Figure 6:
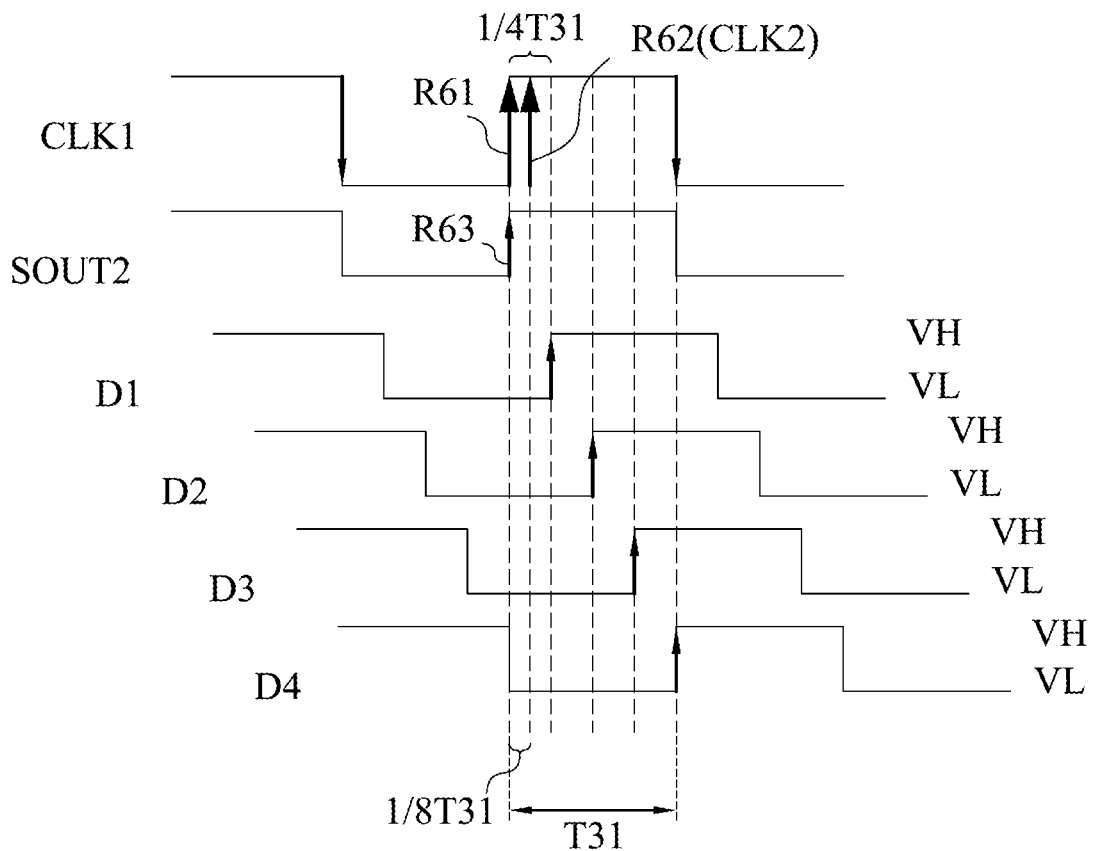
FIG. 6 is a timing diagram of the signals associated with the delay locked loop device and the controllers illustrated according to some embodiments of this disclosure.

FIG. 6 is a timing diagram 600 of the signals associated with the delay locked loop device 100 and the controllers 400, 500 illustrated according to some embodiments of this disclosure.

As illustratively shown in FIG. 6, the clock signal CLK1 includes a rising edge R61. The clock signal CLK2 has a waveform similar to the clock signal CLK1 but delayed by one eighth of the time interval T31. The clock signal CLK2 includes a rising edge R62 corresponding to the rising edge R61. The rising edge R62 of the clock signal CLK2 is shown in the timing diagram 600 while other parts of the clock signal CLK2 is omitted in the timing diagram 600 for brevity.

As illustratively shown in FIG. 6, the output signal SOUT2 includes a rising edge R63. Referring to FIG. 3 and FIG. 6, the rising edges R61 and R63 correspond to the rising edges R34 and R37, respectively.

In the embodiment shown in FIG. 6, the output signal SOUT2 is biased by a time interval smaller than one fourth of the time interval T31. The rising edge R63 is referred to as being aligned with the rising edge R61.

Referring to FIG. 5 and FIG. 6, the flip flop circuits FF51-FF54 are configured to be triggered by the rising edge R62 and generate the bits B1-B4 according to voltage levels of the signals D1-D4 at a moment of the rising edge R62. In some embodiment, the voltage level VH corresponds to a logic value 1, and the voltage level VL corresponds to a logic value 0. As illustratively shown in FIG. 6, each of the signals D1-D4 has the voltage level VL at the moment of the rising edge R62. Accordingly, logic values of the bits B1-B4 are 0, 0, 0 and 0, respectively.

Figure 7A:
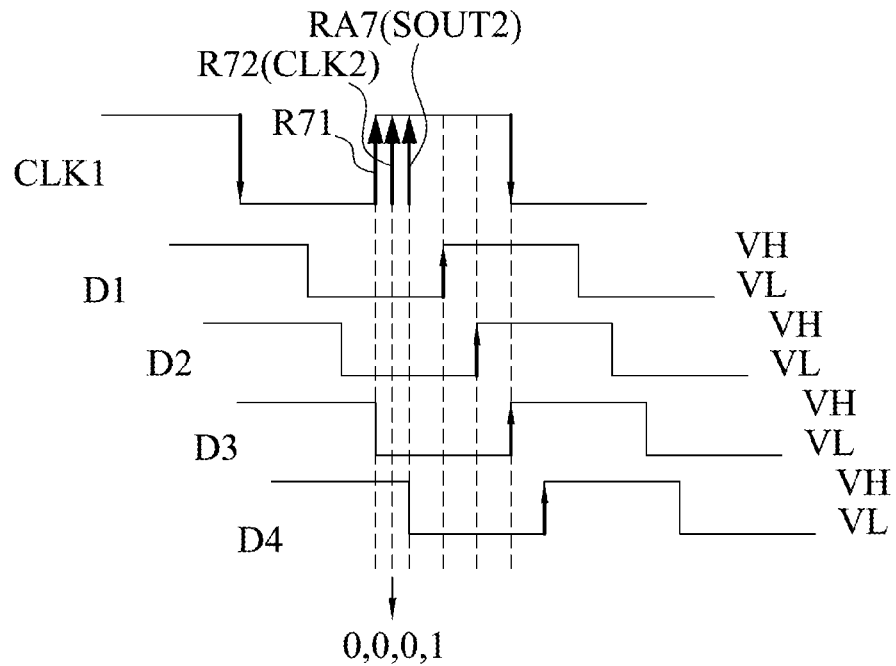
FIGS. 7A-7H are timing diagrams of the signals associated with the delay locked loop device and the controllers illustrated according to some embodiments of this disclosure.

FIG. 7A is a timing diagram 700A of the signals associated with the delay locked loop device 100 and the controllers 400, 500 illustrated according to some embodiments of this disclosure.

As illustratively shown in FIG. 7A, the clock signal CLK1 includes a rising edge R71. The clock signal CLK2 has a waveform similar to the clock signal CLK1 but delayed by one eighth of the time interval T31. The clock signal CLK2 includes a rising edge R72 corresponding to the rising edge R71. The output signal SOUT2 has a waveform similar to the clock signal CLK1 but delayed by one fourth of the time interval T31. The output signal SOUT2 includes a rising edge RA7 corresponding to the rising edge R71. The rising edge R72 of the clock signal CLK2 and the rising edge RA7 of the output signal SOUT2 are shown in the timing diagram 700A while other parts of the clock signal CLK2 and the output signal SOUT2 are omitted in the timing diagram 700A for brevity. Referring to FIG. 3 and FIG. 7A, the rising edges R71 and RA7 correspond to the rising edges R34 and R37, respectively.

In the embodiment shown in FIG. 7A, the output signal SOUT2 is delayed by a time interval which is approximately one fourth of the time interval T31. The rising edge RA7 is at the right side of the rising edge R71 and spaced from the rising edge R71 by one fourth of the time interval T31.

Referring to FIG. 5 and FIG. 7A, the flip flop circuits FF51-FF54 are configured to be triggered by the rising edge R72 and generate the bits B1-B4 according to voltage levels of the signals D1-D4 at a moment of the rising edge R72. As illustratively shown in FIG. 7A, at the moment of the rising edge R72, the signals D1-D4 have the voltage levels VL, VL, VL and VH. Accordingly, logic values of the bits B1-B4 are 0, 0, 0 and 1, respectively.

FIGS. 7B-7H are timing diagrams 700B-700H of the signals associated with the delay locked loop device 100 and the controllers 400, 500 illustrated according to some embodiments of this disclosure. Each of the timing diagram 700B-700H are similar to the timing diagram 700A shown FIG. 7A, and thus some descriptions are not repeated for brevity.

Figure 7B:
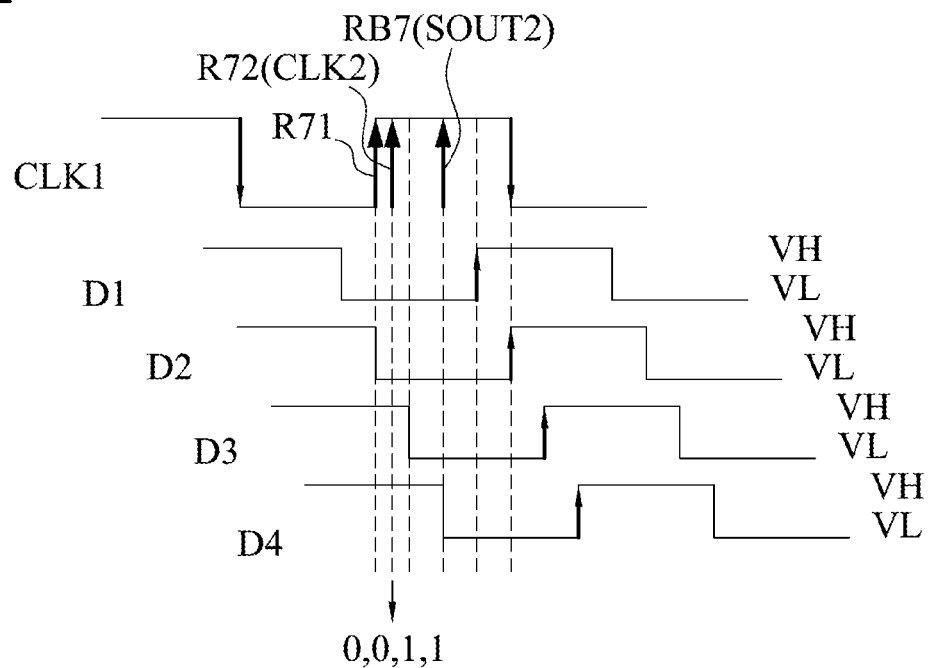

As illustratively shown in FIG. 7B, the output signal SOUT2 includes a rising edge RB7 corresponding to the rising edge R71. Referring to FIG. 3 and FIG. 7B, the rising edges R71 and RB7 correspond to the rising edges R34 and R37, respectively.

In the embodiment shown in FIG. 7B, the output signal SOUT2 is delayed by a time interval which is approximately a half of the time interval T31. The rising edge RB7 is at the right side of the rising edge R71 and spaced from the rising edge R71 by a half of the time interval T31.

As illustratively shown in FIG. 7B, at the moment of the rising edge R72, the signals D1-D4 generated according to the output signal SOUT2 with the rising edge RB7 have the voltage levels VL, VL, VH and VH. Accordingly, logic values of the bits B1-B4 are 0, 0, 1 and 1, respectively.

Figure 7C:
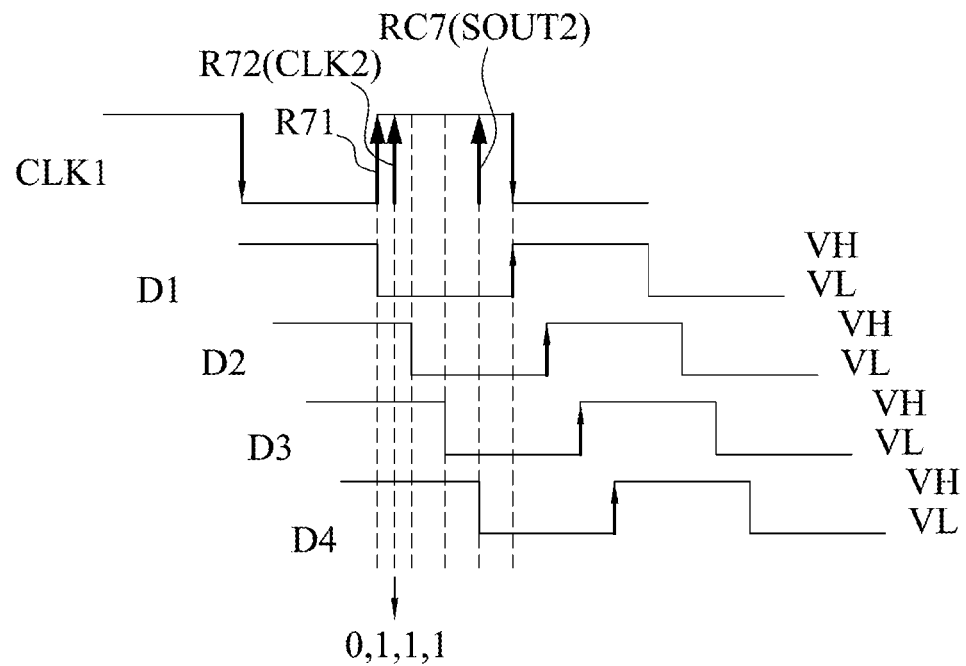

As illustratively shown in FIG. 7C, the output signal SOUT2 includes a rising edge RC7 corresponding to the rising edge R71. Referring to FIG. 3 and FIG. 7C, the rising edges R71 and RC7 correspond to the rising edges R34 and R37, respectively.

In the embodiment shown in FIG. 7C, the output signal SOUT2 is delayed by a time interval which is approximately three fourth of the time interval T31. The rising edge RC7 is at the right side of the rising edge R71 and spaced from the rising edge R71 by three fourth of the time interval T31.

As illustratively shown in FIG. 7C, at the moment of the rising edge R71, the signals D1-D4 generated according to the output signal SOUT2 with the rising edge RC7 have the voltage levels VL, VH, VH and VH. Accordingly, logic values of the bits B1-B4 are 0, 1, 1 and 1, respectively.

Figure 7D:
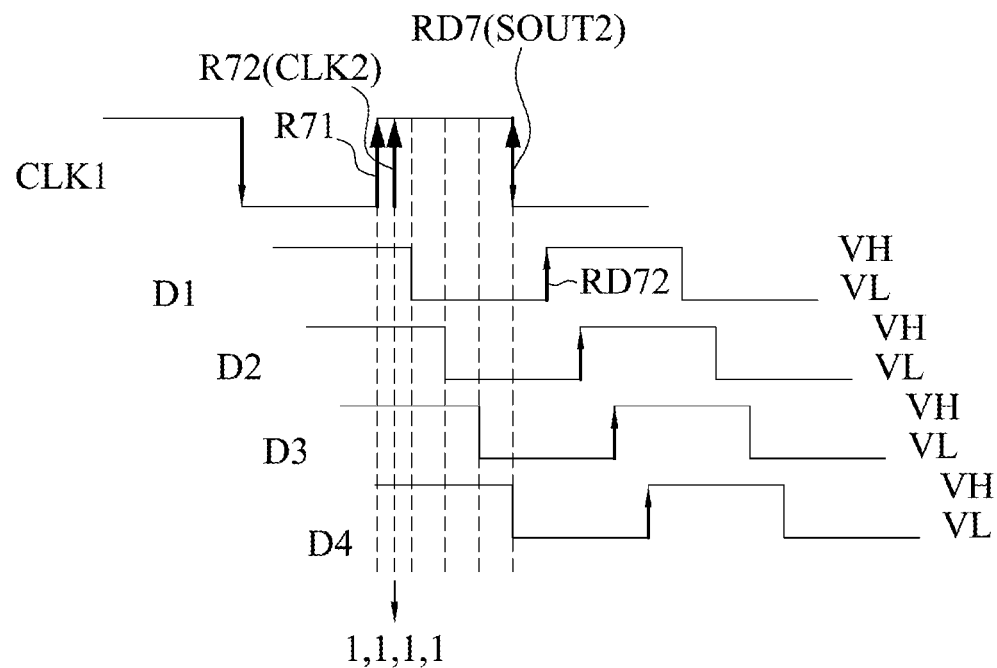

As illustratively shown in FIG. 7D, the output signal SOUT2 includes a rising edge RD7 corresponding to the rising edge R71. Referring to FIG. 3 and FIG. 7D, the rising edges R71 and RD7 correspond to the rising edges R34 and R37, respectively.

In the embodiment shown in FIG. 7D, the output signal SOUT2 is delayed by a time interval which is approximately the time interval T31. The rising edge RD7 is at the right side of the rising edge R71 and spaced from the rising edge R71 by the time interval T31.

As illustratively shown in FIG. 7D, at the moment of the rising edge R71, the signals D1-D4 generated according to the output signal SOUT2 with the rising edge RD7 have the voltage levels VH, VH, VH and VH. Accordingly, logic values of the bits B1-B4 are 1, 1, 1 and 1, respectively.

Figure 7E:
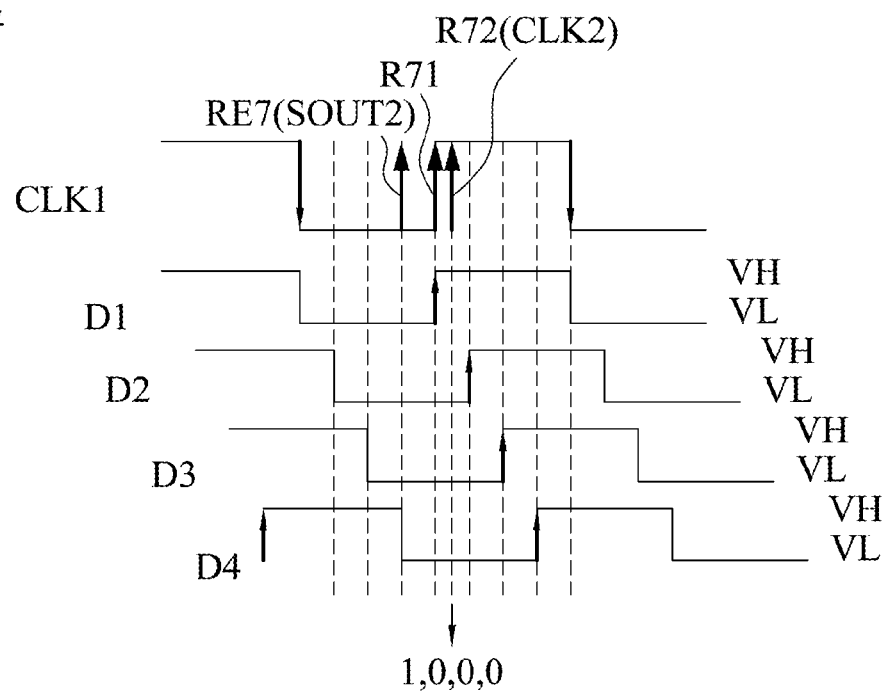

As illustratively shown in FIG. 7E, the output signal SOUT2 includes a rising edge RE7 corresponding to the rising edge R71. Referring to FIG. 3 and FIG. 7E, the rising edges R71 and RE7 correspond to the rising edges R34 and R37, respectively.

In the embodiment shown in FIG. 7E, the output signal SOUT2 is moved ahead with respect to time by a time interval which is approximately one fourth of the time interval T31. The rising edge RE7 is at the left side of the rising edge R71 and spaced from the rising edge R71 by one fourth of the time interval T31.

As illustratively shown in FIG. 7E, at the moment of the rising edge R71, the signals D1-D4 generated according to the output signal SOUT2 with the rising edge RE7 have the voltage levels VH, VL, VL and VL. Accordingly, logic values of the bits B1-B4 are 1, 0, 0 and 0, respectively.

Figure 7F:
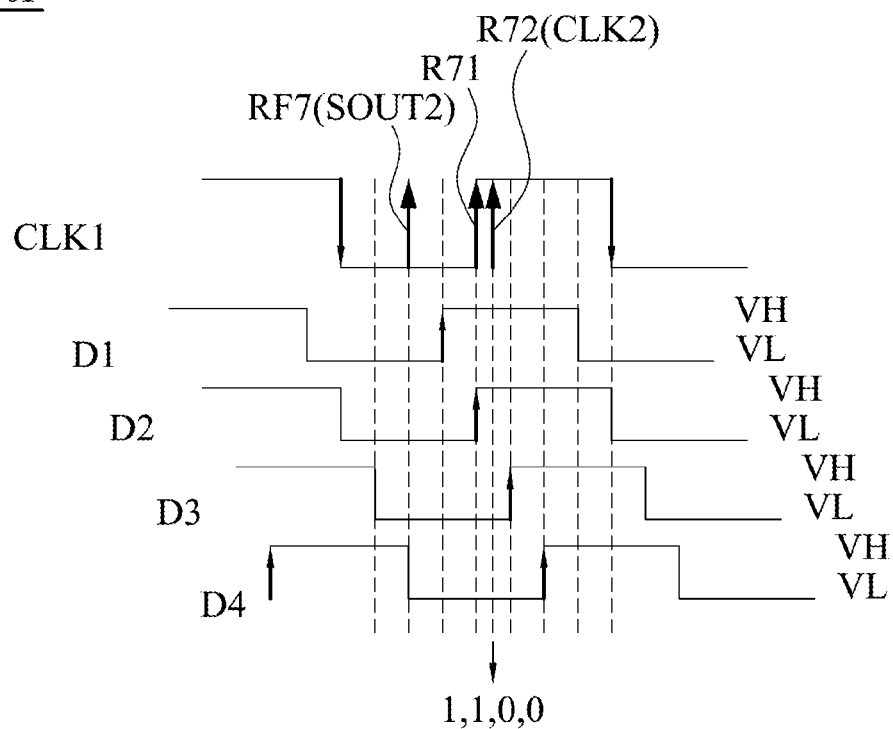

As illustratively shown in FIG. 7F, the output signal SOUT2 includes a rising edge RF7 corresponding to the rising edge R71. Referring to FIG. 3 and FIG. 7F, the rising edges R71 and RF7 correspond to the rising edges R34 and R37, respectively.

In the embodiment shown in FIG. 7F, the output signal SOUT2 is moved ahead with respect to time by a time interval which is approximately a half of the time interval T31. The rising edge RF7 is at the left side of the rising edge R71 and spaced from the rising edge R71 by a half of the time interval T31.

As illustratively shown in FIG. 7F, at the moment of the rising edge R71, the signals D1-D4 generated according to the output signal SOUT2 with the rising edge RF7 have the voltage levels VH, VH, VL and VL. Accordingly, logic values of the bits B1-B4 are 1, 1, 0 and 0, respectively.

Figure 7G:
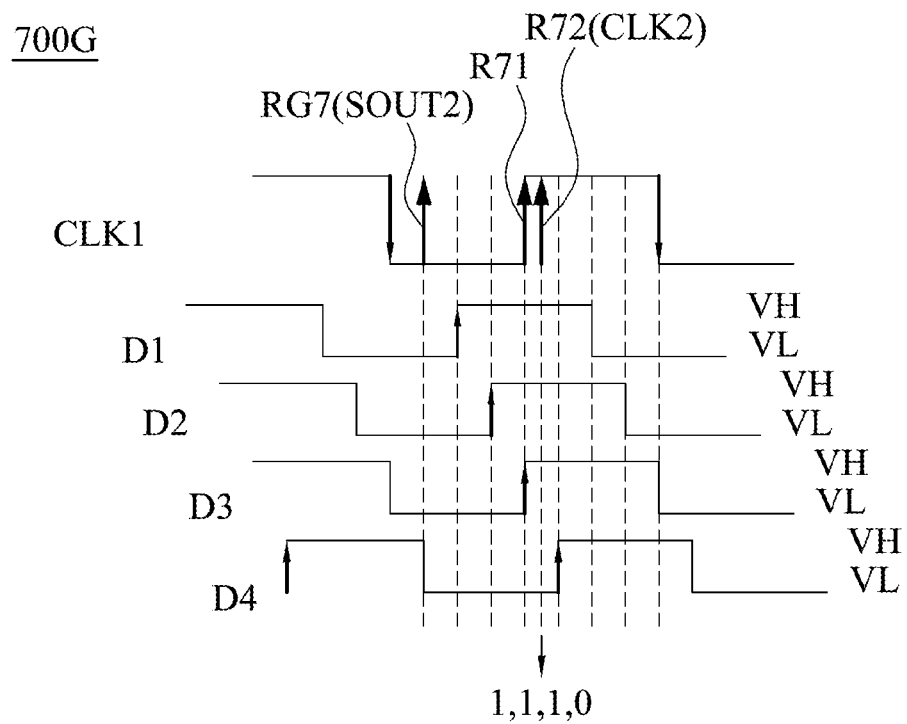

As illustratively shown in FIG. 7G, the output signal SOUT2 includes a rising edge RG7 corresponding to the rising edge R71. Referring to FIG. 3 and FIG. 7G, the rising edges R71 and RG7 correspond to the rising edges R34 and R37, respectively.

In the embodiment shown in FIG. 7G, the output signal SOUT2 is moved ahead with respect to time by a time interval which is approximately three fourth of the time interval T31. The rising edge RG7 is at the left side of the rising edge R71 and spaced from the rising edge R71 by three fourth of the time interval T31.

As illustratively shown in FIG. 7G, at the moment of the rising edge R71, the signals D1-D4 generated according to the output signal SOUT2 with the rising edge RG7 have the voltage levels VH, VH, VH and VL. Accordingly, logic values of the bits B1-B4 are 1, 1, 1 and 0, respectively.

Figure 7H:
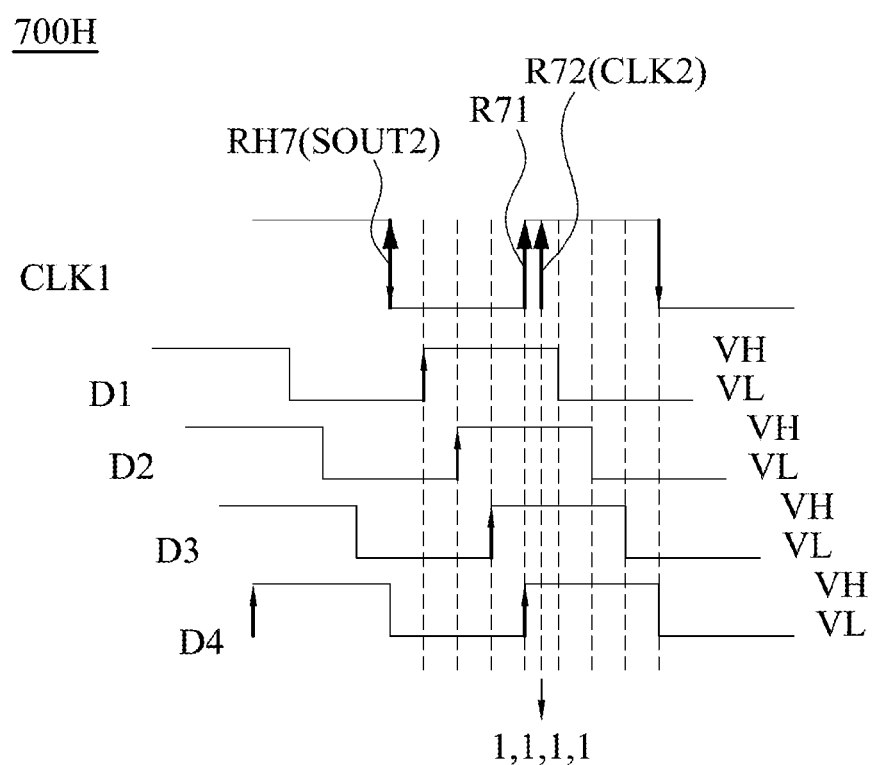

As illustratively shown in FIG. 7H, the output signal SOUT2 includes a rising edge RH7 corresponding to the rising edge R71. Referring to FIG. 3 and FIG. 7H, the rising edges R71 and RH7 correspond to the rising edges R34 and R37, respectively.

In the embodiment shown in FIG. 7H, the output signal SOUT2 is moved ahead with respect to time by a time interval which is approximately the time interval T31. The rising edge RH7 is at the left side of the rising edge R71 and spaced from the rising edge R71 by the time interval T31.

As illustratively shown in FIG. 7H, at the moment of the rising edge R71, the signals D1-D4 generated according to the output signal SOUT2 with the rising edge RH7 have the voltage levels VH, VH, VH and VH. Accordingly, logic values of the bits B1-B4 are 1, 1, 1 and 1, respectively.

FIG. 7I is a truth table of the bits B1-B4 corresponding to delaying and moving ahead conditions of the output signal SOUT2 illustrated according to some embodiments of this disclosure. As illustratively shown in FIG. 7I, some combinations of logic values of the bits B1-B4 do not occur. For example, the bits B1-B4 do not have a combination of the logic values 0, 0, 1, 0 in the embodiments shown in FIGS. 7A-7H. The truth table shown in FIG. 7I correspond to eight conditions of the output signal SOUT2.

The present disclosure is not limited to the embodiments described above. Various numbers of the delay lines, signals delayed by the delay lines and corresponding bits, and various time intervals for delaying the clock signal CLK1 are contemplated as being within the scope of the present disclosure. For example, in some other embodiments, the controller 150 may include eight delay lines for generating eight signals, eight flip flop circuits for generating eight bits corresponding to the eight signals, and another delay line for delaying the clock signal CLK1 by one sixteenth of the time interval T31.

Figure 8:
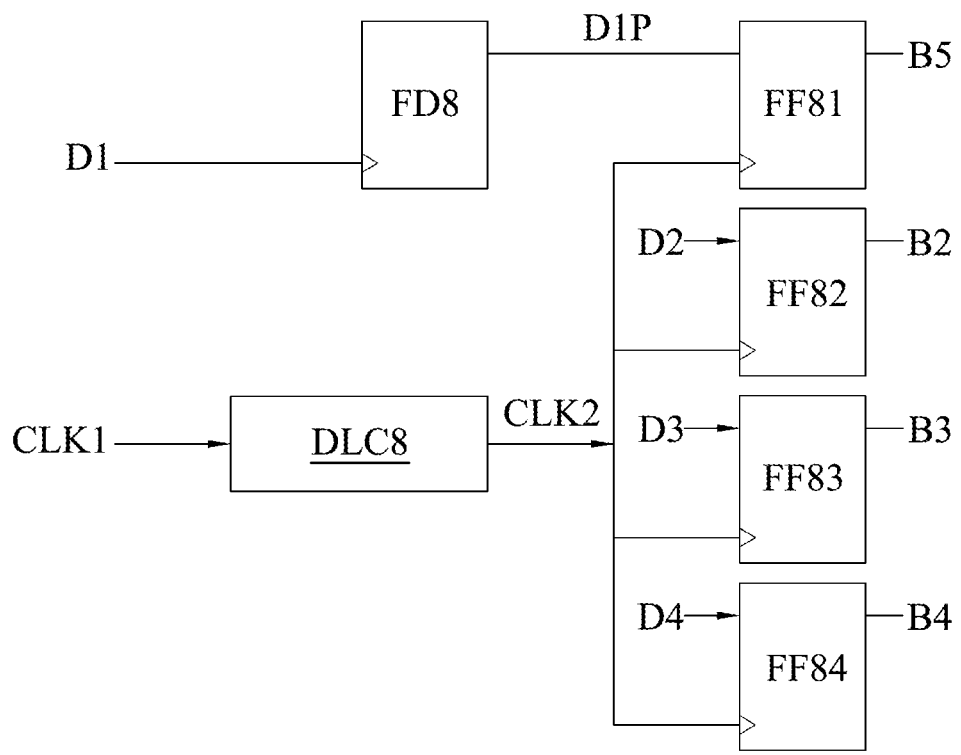
FIG. 8 is a schematic diagram of a controller illustrated according to some embodiments of this disclosure.

FIG. 8 is a schematic diagram of a controller 800 illustrated according to some embodiments of this disclosure. The controller 800 is an embodiment of the controller 150 shown in FIG. 1, and is an alternative embodiment of the controller 500 shown in FIG. 5. In some embodiments, the controller 800 is configured to receive the clock signal CLK1 and the signals D1-D4, and configured to generate bits B5 and B2-B4 according to the clock signal CLK1 and the signals D1-D4. Referring to FIG. 1 and FIG. 8, the controller 800 is configured to control the delay line 106 according to the bits B1-B4. In some embodiments, the controller 800 includes the delay lines DL41-DL44 shown in FIG. 4.

As illustratively shown in FIG. 8, the controller 800 includes a delay line DLC8, a frequency divider FD8 and flip flop circuits FF81-FF84. In some embodiments, the frequency divider FD8 is implemented as a T-type flip flop circuit. The delay line DLC8 corresponds to the delay line DLC5 shown in FIG. 5, and is configured to delay the clock signal CLK1 by one eighth of the time interval T31 to generate a clock signal CLK2. The frequency divider FD8 is configured to divide a frequency of the signal D1 to generate a signal D1P which has a frequency lower than the frequency of the signal D1.

Figure 9A:
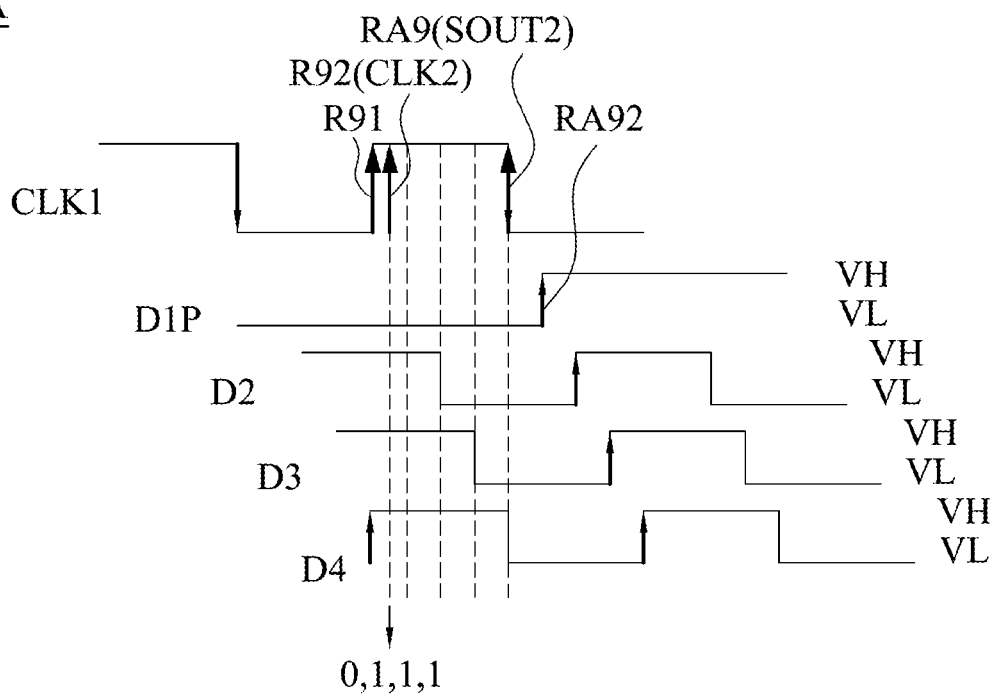
FIGS. 9A-9N are timing diagrams of the signals associated with the delay locked loop device and the controllers illustrated according to some embodiments of this disclosure.

For example, referring to FIG. 8, FIG. 9A and FIG. 7D, the frequency divider FD8 receive the signal D1 and transform the signal D1 into the signal D1P which has a half of the frequency of the signal D1, and the rising edge RA92 of the signal D1P and the rising edge RD72 of the signal D1 are positioned at a same moment. In some embodiments, the frequency of the signal D1P is lower than or equal to a half of the frequency of the signal D1.

As illustratively shown in FIG. 8, the flip flop circuit FF81 is configured to generate the bit B5 according to the clock signal CLK2 and the signal D1P. The flip flop circuit FF82 is configured to generate the bit B2 according to the clock signal CLK2 and the signal D2. The flip flop circuit FF83 is configured to generate the bit B3 according to the clock signal CLK2 and the signal D3. The flip flop circuit FF84 is configured to generate the bit B4 according to the clock signal CLK2 and the signal D4. In some embodiments, the flip flop circuits FF81-FF84 are triggered by a rising edge of the clock signal CLK2.

FIG. 9A is a timing diagram 900A of the signals associated with the delay locked loop device 100 and the controllers 500, 800 illustrated according to some embodiments of this disclosure.

As illustratively shown in FIG. 9A, the clock signal CLK1 includes a rising edge R91. The clock signal CLK2 has a waveform similar to the clock signal CLK1 but delayed by one eighth of the time interval T31. The clock signal CLK2 includes a rising edge R92 corresponding to the rising edge R91. The output signal SOUT2 has a waveform similar to the clock signal CLK1 but delayed by the time interval T31. The output signal SOUT2 includes a rising edge RA9 corresponding to the rising edge R91. The rising edge R92 of the clock signal CLK2 and the rising edge RA9 of the output signal SOUT2 are shown in the timing diagram 900A while other parts of the clock signal CLK2 and the output signal SOUT2 are omitted in the timing diagram 900A for brevity. Referring to FIG. 3 and FIG. 9A, the rising edges R91 and RA9 correspond to the rising edges R34 and R37, respectively.

In the embodiment shown in FIG. 9A, the output signal SOUT2 is delayed by a time interval which is approximately the time interval T31. The rising edge RA9 is at the right side of the rising edge R91 and spaced from the rising edge R91 by the time interval T31.

Referring to FIG. 8 and FIG. 9A, the flip flop circuits FF81-FF84 are configured to be triggered by the rising edge R92 and generate the bits B5 and B2-B4 according to voltage levels of the signals D1P and D2-D4 at a moment of the rising edge R92. As illustratively shown in FIG. 9A, at the moment of the rising edge R92, the signals D1P, D2, D3 and D4 have the voltage levels VL, VH, VH and VH. Accordingly, logic values of the bits B5, B2, B3 and B4 are 0, 1, 1 and 1, respectively.

FIGS. 9B-9N are timing diagram 900B-900N of the signals associated with the delay locked loop device 100 and the controllers 500, 800 illustrated according to some embodiments of this disclosure. Each of the timing diagram 900B-900N are similar to the timing diagram 900A shown FIG. 9A, and thus some descriptions are not repeated for brevity.

Figure 9B:
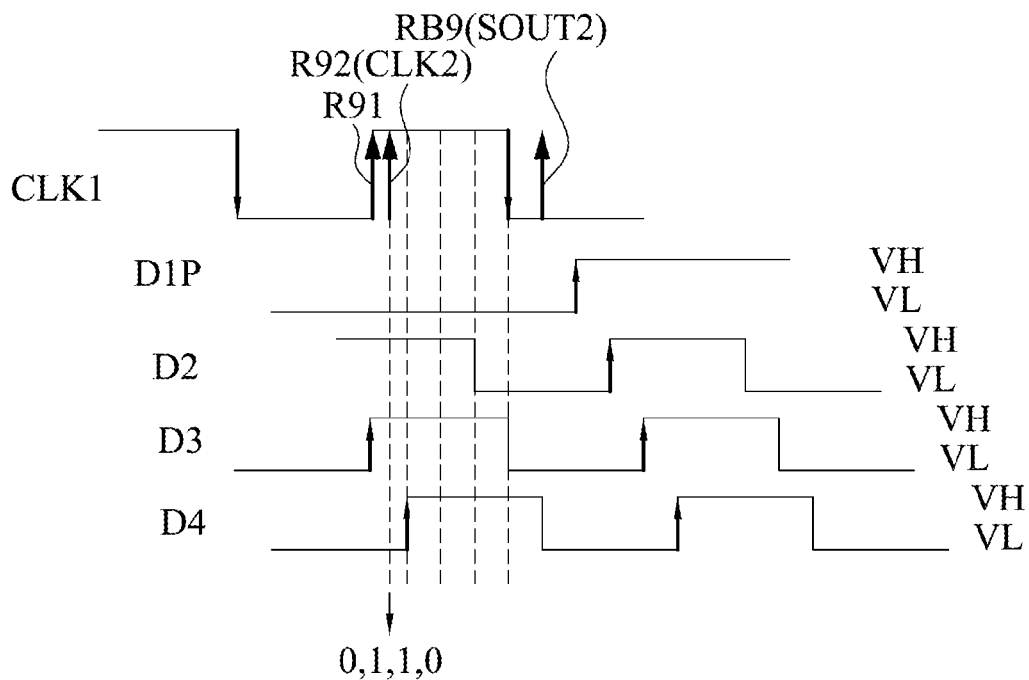

As illustratively shown in FIG. 9B, the output signal SOUT2 includes a rising edge RB9 corresponding to the rising edge R91. Referring to FIG. 3 and FIG. 9B, the rising edges R91 and RB9 correspond to the rising edges R34 and R37, respectively.

In the embodiment shown in FIG. 9B, the output signal SOUT2 is delayed by a time interval which is approximately one and one fourth of the time interval T31. The rising edge RB9 is at the right side of the rising edge R91 and spaced from the rising edge R91 by one and one fourth of the time interval T31.

As illustratively shown in FIG. 9B, at the moment of the rising edge R92, the signals D1P, D2, D3 and D4 generated according to the output signal SOUT2 with the rising edge RB9 have the voltage levels VL, VH, VH and VL. Accordingly, logic values of the bits B5, B2, B3 and B4 are 0, 1, 1 and 0, respectively.

Figure 9C:
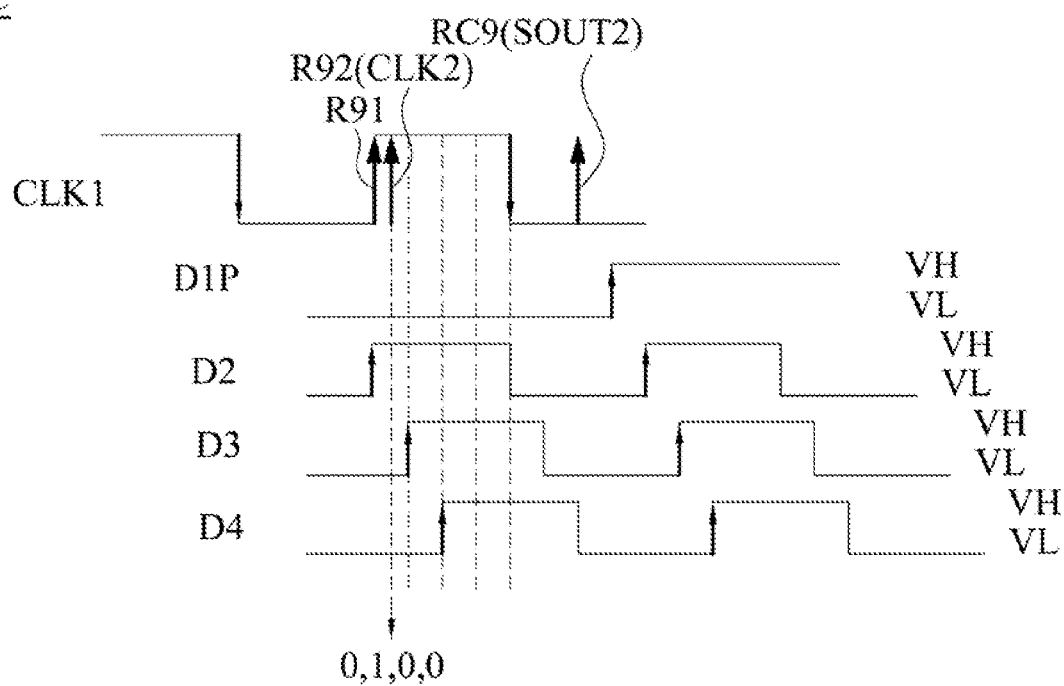

As illustratively shown in FIG. 9C, the output signal SOUT2 includes a rising edge RC9 corresponding to the rising edge R91. Referring to FIG. 3 and FIG. 9C, the rising edges R91 and RC9 correspond to the rising edges R34 and R37, respectively.

In the embodiment shown in FIG. 9C, the output signal SOUT2 is delayed by a time interval which is approximately one and a half of the time interval T31. The rising edge RC9 is at the right side of the rising edge R91 and spaced from the rising edge R91 by one and a half of the time interval T31.

As illustratively shown in FIG. 9C, at the moment of the rising edge R92, the signals D1P, D2, D3 and D4 generated according to the output signal SOUT2 with the rising edge RC9 have the voltage levels VL, VH, VL and VL. Accordingly, logic values of the bits B5, B2, B3 and B4 are 0, 1, 0 and 0, respectively.

Figure 9D:
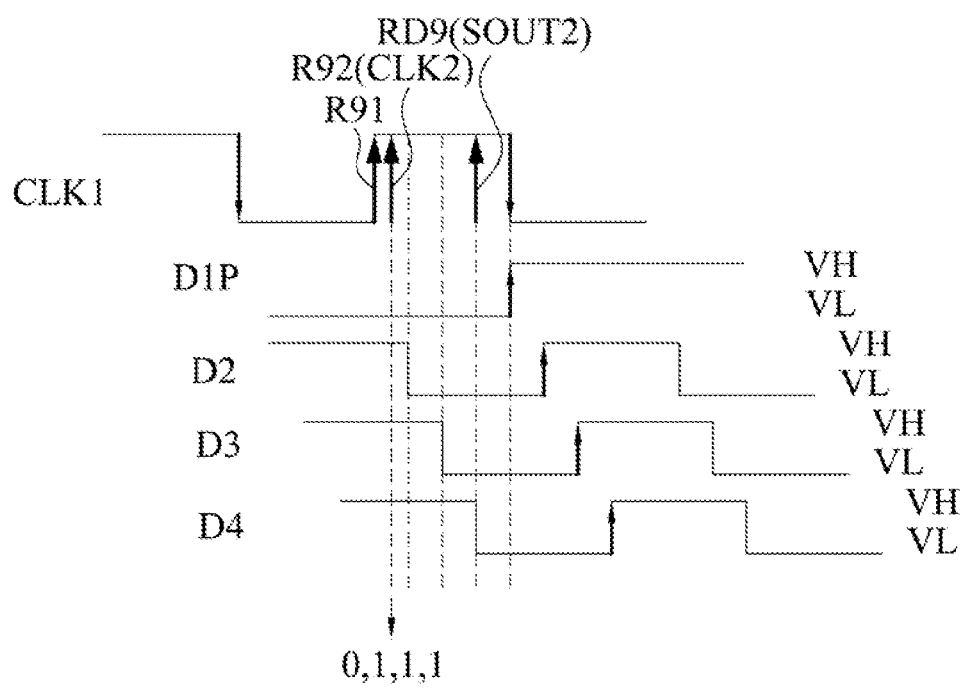

As illustratively shown in FIG. 9D, the output signal SOUT2 includes a rising edge RD9 corresponding to the rising edge R91. Referring to FIG. 3 and FIG. 9D, the rising edges R91 and RD9 correspond to the rising edges R34 and R37, respectively.

In the embodiment shown in FIG. 9D, the output signal SOUT2 is delayed by a time interval which is approximately three fourth of the time interval T31. The rising edge RD9 is at the right side of the rising edge R91 and spaced from the rising edge R91 by three fourth of the time interval T31.

As illustratively shown in FIG. 9D, at the moment of the rising edge R92, the signals D1P, D2, D3 and D4 generated according to the output signal SOUT2 with the rising edge RD9 have the voltage levels VL, VH, VH and VH. Accordingly, logic values of the bits B5, B2, B3 and B4 are 0, 1, 1 and 1, respectively.

Figure 9E:
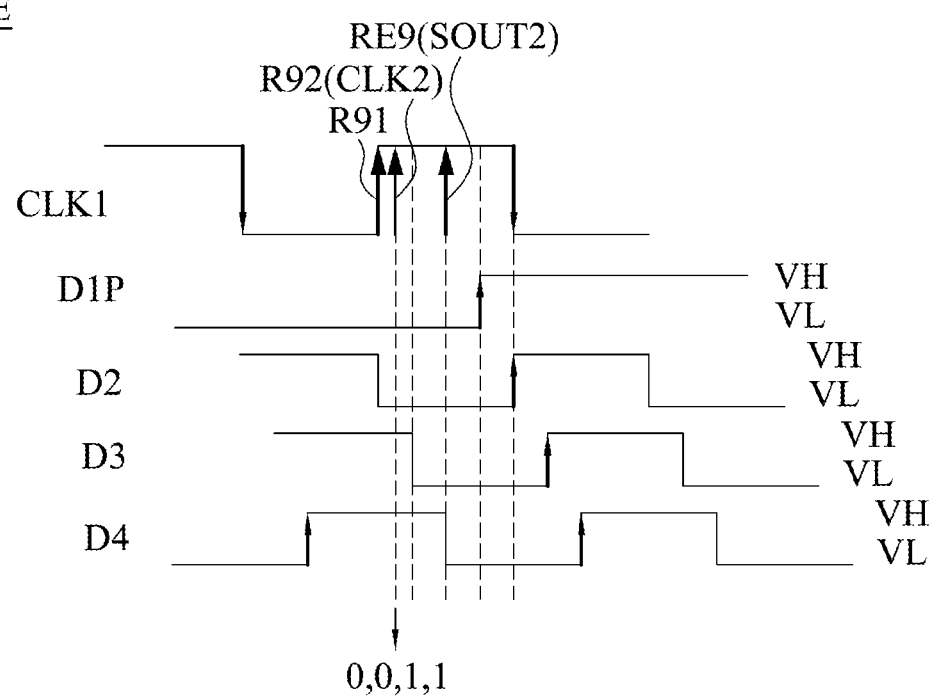

As illustratively shown in FIG. 9E, the output signal SOUT2 includes a rising edge RE9 corresponding to the rising edge R91. Referring to FIG. 3 and FIG. 9E, the rising edges R91 and RE9 correspond to the rising edges R34 and R37, respectively.

In the embodiment shown in FIG. 9E, the output signal SOUT2 is delayed by a time interval which is approximately a half of the time interval T31. The rising edge RE9 is at the right side of the rising edge R91 and spaced from the rising edge R91 by a half of the time interval T31.

As illustratively shown in FIG. 9E, at the moment of the rising edge R92, the signals D1P, D2, D3 and D4 generated according to the output signal SOUT2 with the rising edge RE9 have the voltage levels VL, VL, VH and VH. Accordingly, logic values of the bits B5, B2, B3 and B4 are 0, 0, 1 and 1, respectively.

Figure 9F:
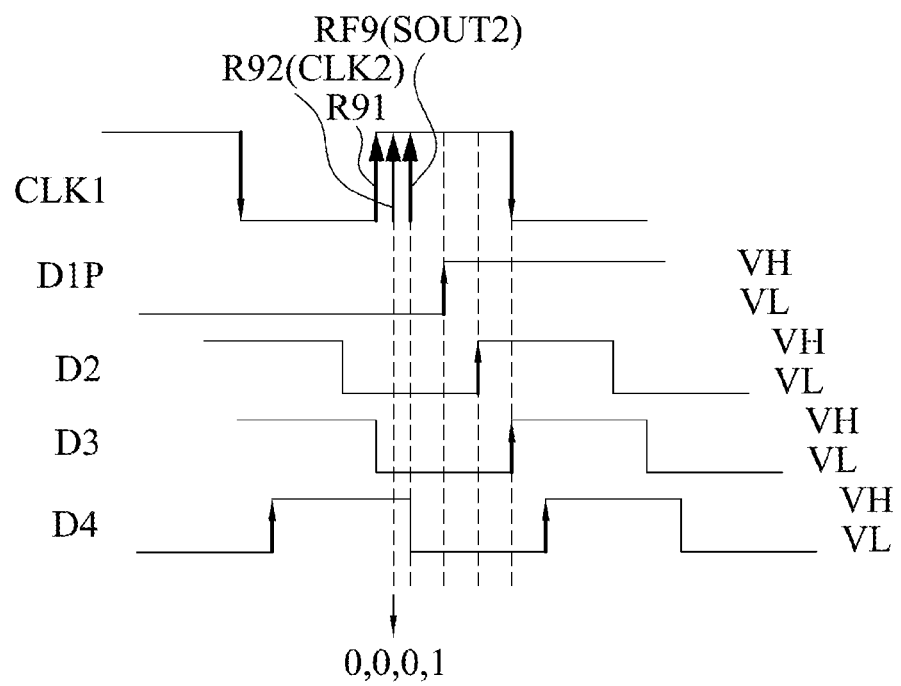

As illustratively shown in FIG. 9F, the output signal SOUT2 includes a rising edge RF9 corresponding to the rising edge R91. Referring to FIG. 3 and FIG. 9F, the rising edges R91 and RF9 correspond to the rising edges R34 and R37, respectively.

In the embodiment shown in FIG. 9F, the output signal SOUT2 is delayed by a time interval which is approximately one fourth of the time interval T31. The rising edge RF9 is at the right side of the rising edge R91 and spaced from the rising edge R91 by one fourth of the time interval T31.

As illustratively shown in FIG. 9F, at the moment of the rising edge R92, the signals D1P, D2, D3 and D4 generated according to the output signal SOUT2 with the rising edge RF9 have the voltage levels VL, VL, VL and VH. Accordingly, logic values of the bits B5, B2, B3 and B4 are 0, 0, 0 and 1, respectively.

Figure 9G:
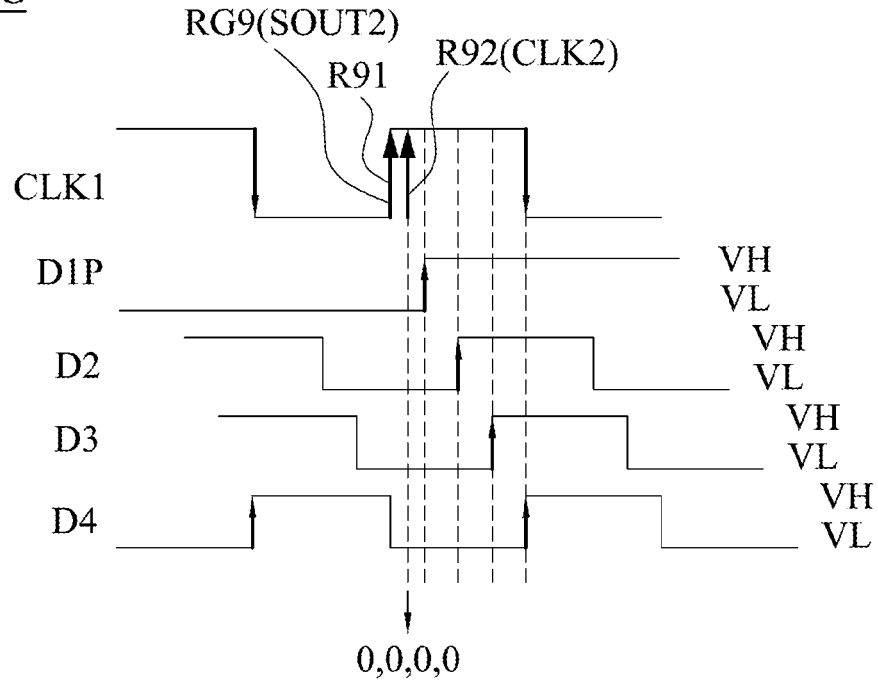

As illustratively shown in FIG. 9G, the output signal SOUT2 includes a rising edge RG9 corresponding to the rising edge R91. Referring to FIG. 3 and FIG. 9G, the rising edges R91 and RG9 correspond to the rising edges R34 and R37, respectively.

In the embodiment shown in FIG. 9G, the output signal SOUT2 is not delayed or moved ahead, or is delayed or moved ahead by a time interval which is smaller than one fourth of the time interval T31. The rising edge RG9 is referred to as being aligned with the rising edge R91.

As illustratively shown in FIG. 9G, at the moment of the rising edge R92, the signals D1P, D2, D3 and D4 generated according to the output signal SOUT2 with the rising edge RG9 have the voltage levels VL, VL, VL and VL. Accordingly, logic values of the bits B5, B2, B3 and B4 are 0, 0, 0 and 0, respectively.

Figure 9H:
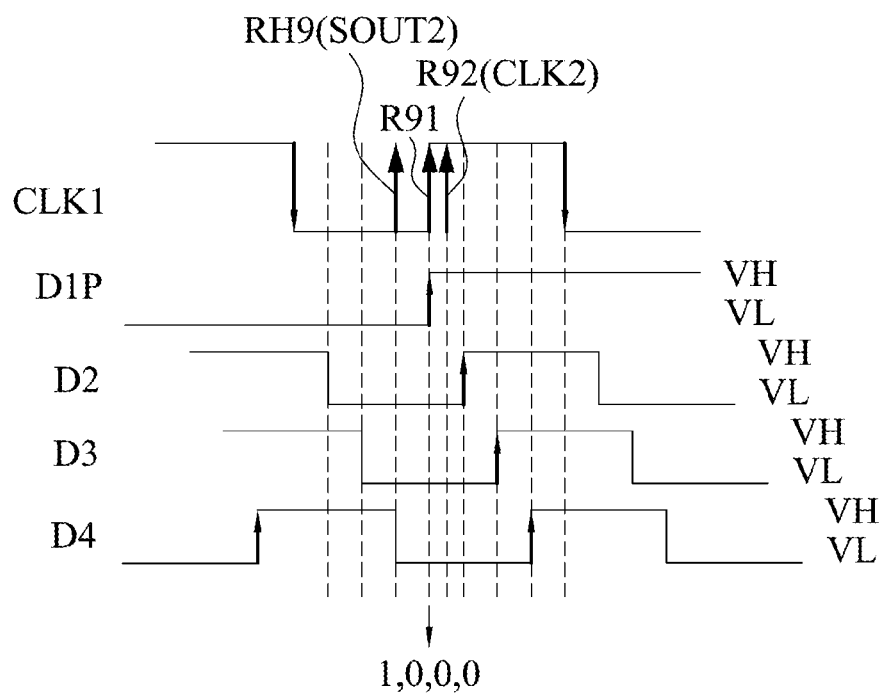

As illustratively shown in FIG. 9H, the output signal SOUT2 includes a rising edge RH9 corresponding to the rising edge R91. Referring to FIG. 3 and FIG. 9H, the rising edges R91 and RH9 correspond to the rising edges R34 and R37, respectively.

In the embodiment shown in FIG. 9H, the output signal SOUT2 is move ahead with respect to time by a time interval which is approximately one fourth of the time interval T31. The rising edge RH9 is at the left side of the rising edge R91 and spaced from the rising edge R91 by one fourth of the time interval T31.

As illustratively shown in FIG. 9H, at the moment of the rising edge R92, the signals D1P, D2, D3 and D4 generated according to the output signal SOUT2 with the rising edge RH9 have the voltage levels VH, VL, VL and VL. Accordingly, logic values of the bits B5, B2, B3 and B4 are 1, 0, 0 and 0, respectively.

Figure 9I:
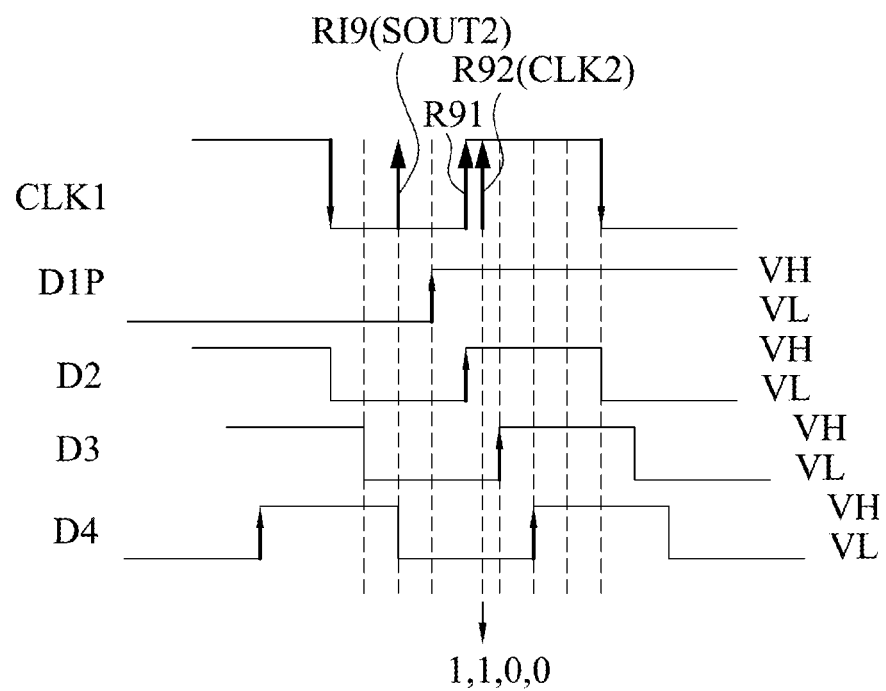

As illustratively shown in FIG. 9I, the output signal SOUT2 includes a rising edge RI9 corresponding to the rising edge R91. Referring to FIG. 3 and FIG. 9I, the rising edges R91 and RI9 correspond to the rising edges R34 and R37, respectively.

In the embodiment shown in FIG. 9I, the output signal SOUT2 is move ahead with respect to time by a time interval which is approximately a half of the time interval T31. The rising edge RI9 is at the left side of the rising edge R91 and spaced from the rising edge R91 by a half of the time interval T31.

As illustratively shown in FIG. 9I, at the moment of the rising edge R92, the signals D1P, D2, D3 and D4 generated according to the output signal SOUT2 with the rising edge RI9 have the voltage levels VH, VH, VL and VL. Accordingly, logic values of the bits B5, B2, B3 and B4 are 1, 1, 0 and 0, respectively.

Figure 9J:
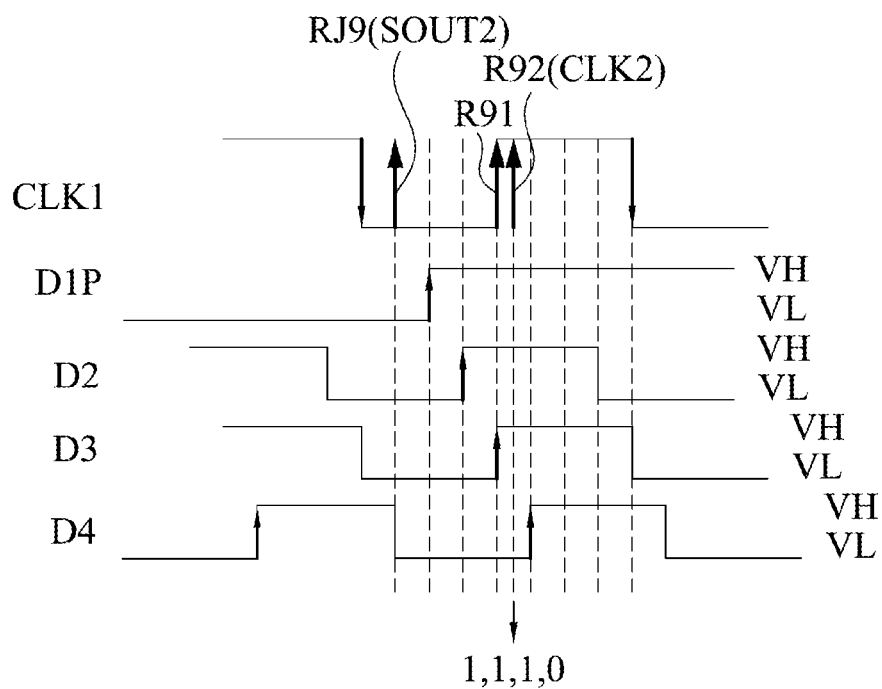

As illustratively shown in FIG. 9J, the output signal SOUT2 includes a rising edge RJ9 corresponding to the rising edge R91. Referring to FIG. 3 and FIG. 9J, the rising edges R91 and RJ9 correspond to the rising edges R34 and R37, respectively.

In the embodiment shown in FIG. 9J, the output signal SOUT2 is move ahead with respect to time by a time interval which is approximately three fourth of the time interval T31. The rising edge RJ9 is at the left side of the rising edge R91 and spaced from the rising edge R91 by three fourth of the time interval T31.

As illustratively shown in FIG. 9J, at the moment of the rising edge R92, the signals D1P, D2, D3 and D4 generated according to the output signal SOUT2 with the rising edge RJ9 have the voltage levels VH, VH, VH and VL. Accordingly, logic values of the bits B5, B2, B3 and B4 are 1, 1, 1 and 0, respectively.

Figure 9K:
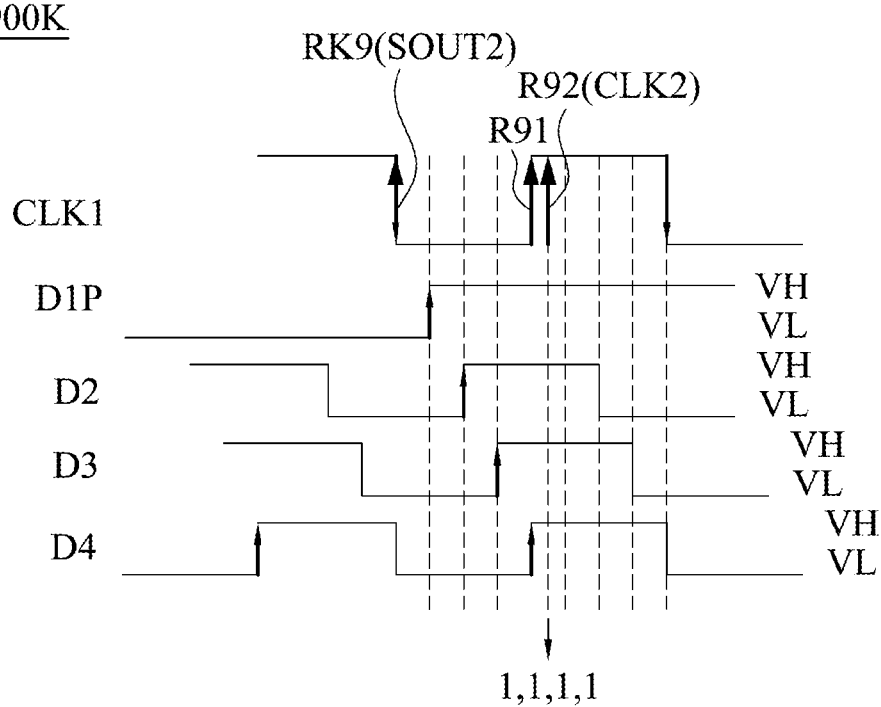

As illustratively shown in FIG. 9K, the output signal SOUT2 includes a rising edge RK9 corresponding to the rising edge R91. Referring to FIG. 3 and FIG. 9K, the rising edges R91 and RK9 correspond to the rising edges R34 and R37, respectively.

In the embodiment shown in FIG. 9K, the output signal SOUT2 is move ahead with respect to time by a time interval which is approximately the time interval T31. The rising edge RK9 is at the left side of the rising edge R91 and spaced from the rising edge R91 by the time interval T31.

As illustratively shown in FIG. 9K, at the moment of the rising edge R92, the signals D1P, D2, D3 and D4 generated according to the output signal SOUT2 with the rising edge RK9 have the voltage levels VH, VH, VH and VH. Accordingly, logic values of the bits B5, B2, B3 and B4 are 1, 1, 1 and 1, respectively.

Figure 9L:
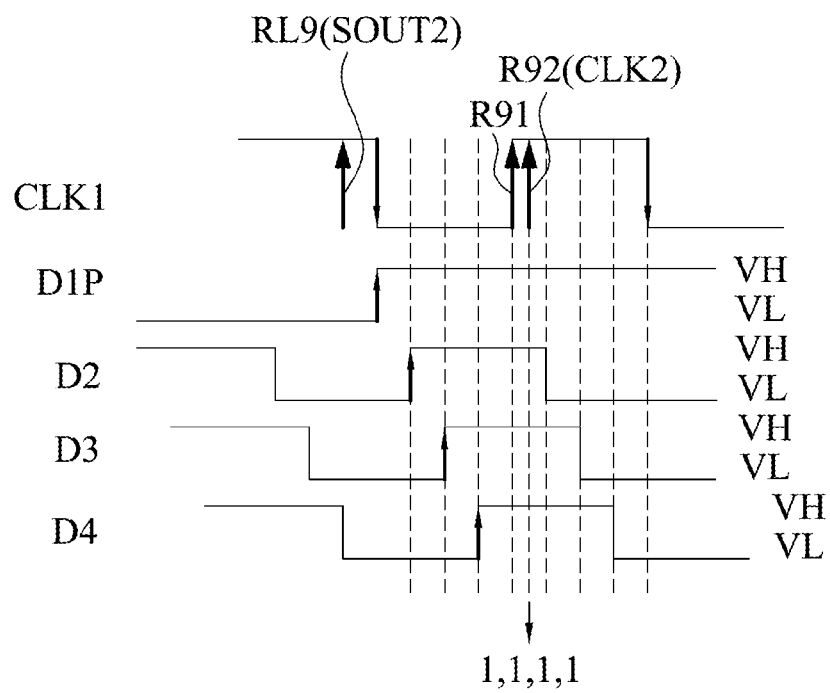

As illustratively shown in FIG. 9L, the output signal SOUT2 includes a rising edge RL9 corresponding to the rising edge R91. Referring to FIG. 3 and FIG. 9L, the rising edges R91 and RL9 correspond to the rising edges R34 and R37, respectively.

In the embodiment shown in FIG. 9L, the output signal SOUT2 is move ahead with respect to time by a time interval which is approximately one and one fourth of the time interval T31. The rising edge RL9 is at the left side of the rising edge R91 and spaced from the rising edge R91 by one and one fourth of the time interval T31.

As illustratively shown in FIG. 9L, at the moment of the rising edge R92, the signals D1P, D2, D3 and D4 generated according to the output signal SOUT2 with the rising edge RL9 have the voltage levels VH, VH, VH and VH. Accordingly, logic values of the bits B5, B2, B3 and B4 are 1, 1, 1 and 1, respectively.

Figure 9M:
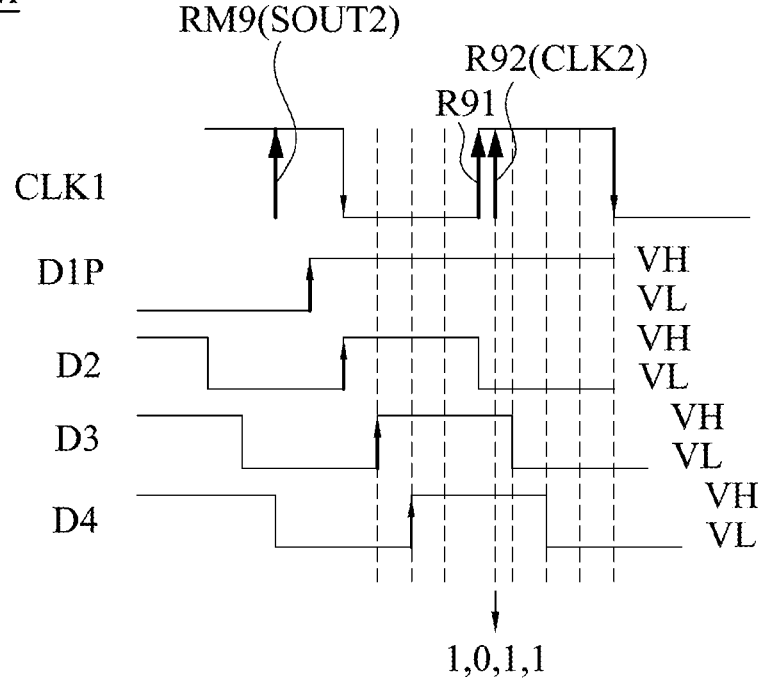

As illustratively shown in FIG. 9M, the output signal SOUT2 includes a rising edge RM9 corresponding to the rising edge R91. Referring to FIG. 3 and FIG. 9M, the rising edges R91 and RM9 correspond to the rising edges R34 and R37, respectively.

In the embodiment shown in FIG. 9M, the output signal SOUT2 is move ahead with respect to time by a time interval which is approximately one and a half of the time interval T31. The rising edge RM9 is at the left side of the rising edge R91 and spaced from the rising edge R91 by one and a half of the time interval T31.

As illustratively shown in FIG. 9M, at the moment of the rising edge R92, the signals D1P, D2, D3 and D4 generated according to the output signal SOUT2 with the rising edge RM9 have the voltage levels VH, VL, VH and VH. Accordingly, logic values of the bits B5, B2, B3 and B4 are 1, 0, 1 and 1, respectively.

Figure 9N:
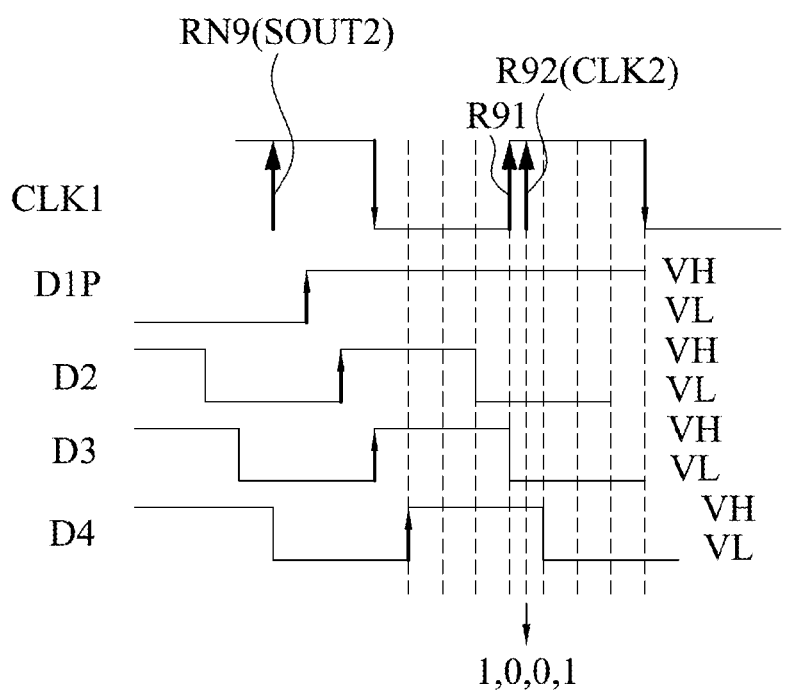

As illustratively shown in FIG. 9N, the output signal SOUT2 includes a rising edge RN9 corresponding to the rising edge R91. Referring to FIG. 3 and FIG. 9N, the rising edges R91 and RN9 correspond to the rising edges R34 and R37, respectively.

In the embodiment shown in FIG. 9N, the output signal SOUT2 is move ahead with respect to time by a time interval which is approximately one and three fourth of the time interval T31. The rising edge RN9 is at the left side of the rising edge R91 and spaced from the rising edge R91 by one and three fourth of the time interval T31.

As illustratively shown in FIG. 9N, at the moment of the rising edge R92, the signals D1P, D2, D3 and D4 generated according to the output signal SOUT2 with the rising edge RN9 have the voltage levels VH, VL, VL and VH. Accordingly, logic values of the bits B5, B2, B3 and B4 are 1, 0, 0 and 1, respectively.

Figure 10:
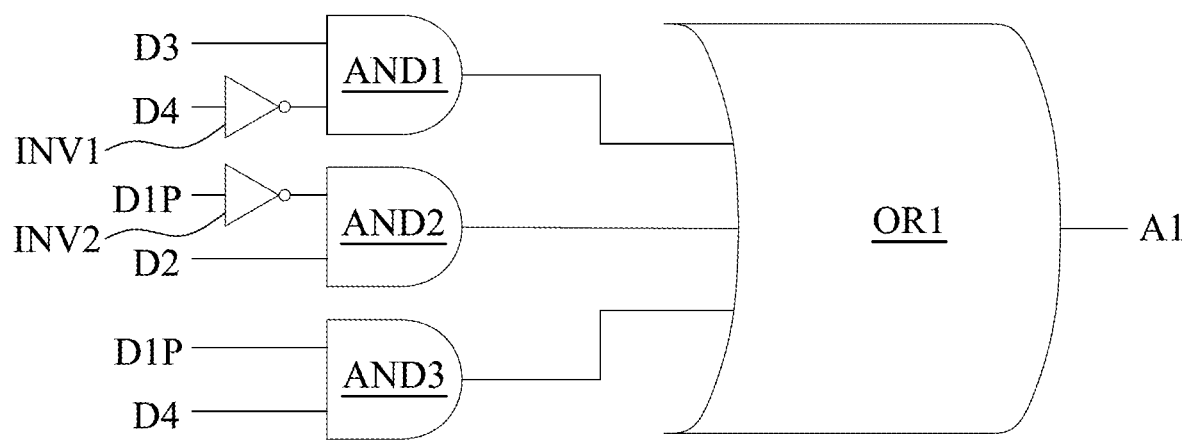
FIG. 10 is a schematic diagram of a logic circuit illustrated according to some embodiments of this disclosure.

FIG. 10 is a schematic diagram of a logic circuit 1000 illustrated according to some embodiments of this disclosure. In some embodiments, the logic circuit 1000 is included in at least one of the controllers 150 and 800 shown in FIG. 1 and FIG. 8, and configured to generate the bit A1 according to logic values of the signals D1P and D2-D4. In some embodiments, the logic values of the signals D1P, D2, D3 and D4 correspond to the bits B5, B2, B3 and B4, respectively.

As illustratively shown in FIG. 10, the logic circuit 1000 includes inverters INV1, INV2, AND gates AND1-AND3 and an OR gate OR1. A first input terminal of the AND gate AND1 is configured to receive the signal D3, a second input terminal of the AND gate AND1 is coupled to an output terminal of the inverter INV1. An input terminal of the inverter INV1 is configured to receive the signal D4. A first input terminal of the AND gate AND2 is configured to receive the signal D2, a second input terminal of the AND gate AND2 is coupled to an output terminal of the inverter INV2. An input terminal of the inverter INV2 is configured to receive the signal D1P. A first input terminal of the AND gate AND3 is configured to receive the signal D1P, a second input terminal of the AND gate AND3 is configured to receive the signal D4. Input terminals of the OR gate OR1 is coupled to the output terminals of the AND gates AND1-AND3. An output terminal of the OR gate OR1 is configured to output the bit A1. In binary expression, the bit A1 is equal to (B3 × $\overline{B4}$) + ($\overline{B5}$ × B2) + (B5 × B4).

The present disclosure is not limited to the embodiments described above. Various logic combinations included in the logic circuit 1000 for generating various bits other than the bit A1 are contemplated as being within the scope of the present disclosure.

FIG. 11 is a truth table of the bits B2-B5 and A1 corresponding to delaying and moving ahead conditions of the output signal SOUT2 illustrated according to some embodiments of this disclosure. As illustratively shown in FIG. 11, some combinations of logic values of the bits B2-B5 do not occur. For example, the bits B5, B2, B3 and B4 do not have a combination of the logic values 0, 0, 1, 0 in the embodiments shown in FIGS. 9A-9N. The truth table shown in FIG. 11 corresponds to twelve conditions of the output signal SOUT2.

Referring to FIG. 1 and FIG. 11, at the operation OP1, in response to the output signal SOUT2 being delayed, the bit B5 has logic value 0 which indicating that the output signal SOUT2 is delayed. Correspondingly, the controller 150 decreases the number of the buffers in the delay line 106 to decrease the delay time of the output signal SOUT2. Similarly, in response to the output signal SOUT2 being moved ahead, the bit B5 has logic value 1 which indicating that the output signal SOUT2 is moved ahead. Correspondingly, the controller 150 increases the number of the buffers in the delay line 106 to increase the delay time of the output signal SOUT2.

Referring to FIG. 1 and FIG. 11, at the operation OP2, in response to the output signal SOUT2 being biased by a time interval larger than or equal to a first time interval (for example, the first time interval may be three fourth of the time interval T31), the bit A1 has logic value 1. Correspondingly, the controller 150 adjusts the number of the buffers in the delay line 106 by a first number, such as ten, to adjust the delay time of the output signal SOUT2 by a second time interval, such as the time interval T31. Similarly, in response to the output signal SOUT2 being biased by a time interval smaller than the first time interval, the bit A1 has logic value 0. Correspondingly, the controller 150 adjusts the number of the buffers in the delay line 106 by a second number, such as one, to adjusts the delay time of the output signal SOUT2 by a third time interval, such as one tenth of the time interval T31. In some embodiments, the second time interval is larger than the third time interval.

The present disclosure is not limited to the embodiments described above. Various time lengths of the first time interval, the second time interval and the third time interval, and the first number and the second number of the buffers are contemplated as being within the scope of the present disclosure.

In summary, in the embodiments of the present disclosure, when the output signal SOUT2 is biased, the controller 150 adjusts the delay time DT of the output signal SOUT2 according to the bits B5 and A1 which correspond to various conditions of the output signal SOUT2 being biased.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method, comprising:
   a delay line delaying a first clock signal by a delay time to generate an output signal;
   a controller delaying the output signal by a first time interval to generate a first signal;
   the controller delaying the first clock signal by a second time interval shorter than the first time interval to generate a second clock signal;
   the controller controlling the delay line according to the first signal and the second clock signal to adjust the delay time; and
   generating a second signal based on the first signal, wherein a frequency of the second signal is equal to or lower than a half of a frequency of the first signal, and an edge of the second signal and an edge of the first signal are positioned at a same moment.

2. The method of claim 1, wherein adjusting the delay time comprises:
   adjusting the delay time according to a voltage level of the second signal at a moment of an edge of the second clock signal.

3. The method of claim 2, wherein adjusting the delay time further comprises:
   increasing the delay time in response to the voltage level being a first voltage level; and
   decreasing the delay time in response to the voltage level being a second voltage level different from the first voltage level.

4. The method of claim 2, wherein a time interval between the edge of the second clock signal and an edge of the first clock signal is substantially equal to the second time interval, and
   adjusting the delay time comprises adjusting the delay time until an edge of the output signal is aligned with the edge of the first clock signal.

5. The method of claim 4, further comprising:
   delaying the first signal by the first time interval to generate a third signal;
   generating a bit based on the voltage level of the second signal at the moment and a voltage level of the third signal at the moment, wherein the bit indicates a time interval between the edge of the output signal and the edge of the first clock signal; and
   adjusting the delay time based on the bit.

6. The method of claim 1, further comprising:
   increasing the delay time in response to a bit corresponding to the second signal having a first logic value; and
   decreasing the delay time in response to the bit corresponding to the second signal having a second logic value different from the first logic value.

7. The method of claim 1, wherein adjusting the delay time comprises:
   generating a bit having a first logic value in response to a third time interval between an edge of the output signal and an edge of the first clock signal being larger than or equal to a fourth time interval;

generating the bit having a second logic value different from the first logic value in response to the third time interval being smaller than the fourth time interval;

adjusting the delay time by a fifth time interval in response to the bit having the first logic value; and adjusting the delay time by a sixth time interval different from the fifth time interval in response to the bit having the second logic value.

8. The method of claim 7, wherein
a time length of the fourth time interval is approximately three eighth of a clock cycle of the first clock signal, and
the fifth time interval is larger than the sixth time interval.

9. A delay locked loop device, comprising:
a first delay line configured to delay a first clock signal by a delay time to generate an output signal; and
a controller configured to control the first delay line to adjust the delay time according to a plurality of bits, and the controller comprising:
a second delay line configured to generate a second clock signal based on the first clock signal;
a frequency divider configured to generate a first signal according to the output signal, wherein a frequency of the first signal is lower than a frequency of the output signal; and
a plurality of flip-flop circuits configured to generate the plurality of bits based on the first signal and the second clock signal.

10. The delay locked loop device of claim 9, wherein the controller further comprises a plurality of delay lines configured to delay the output signal to generate a second signal, and
the frequency divider is configured to generate the first signal based on the second signal, and the frequency of the first signal is lower than or equal to a half of a frequency of the second signal.

11. The delay locked loop device of claim 10, wherein the plurality of delay lines comprises:
a third delay line configured to delay the second signal by a first time interval to generate a third signal;
a fourth delay line configured to delay the third signal by the first time interval to generate a fourth signal; and
a fifth delay line configured to delay the fourth signal the first time interval to generate a fifth signal,
wherein a time length of the first time interval is substantially equal to one eighth of a clock cycle of the first clock signal.

12. The delay locked loop device of claim 9, wherein the controller further comprises:
a third delay line configured to delay the output signal by a first time interval to generate a second signal,
wherein the frequency divider is further configured to receive the second signal and generate the first signal based on the second signal, and
the second delay line is further configured to delay the first clock signal by a second time interval which is shorter than the first time interval to generate the second clock signal.

13. The delay locked loop device of claim 12, wherein a first flip-flop circuit of the plurality of flip-flop circuits is configured to be triggered by an edge of the second clock signal to generate a first bit of the plurality of bits based on a voltage level of the first signal at a moment of the edge of the second clock signal.

14. The delay locked loop device of claim 13, wherein the controller is further configured to increase the delay time in response to the first bit having a first logic value, and configured to decrease the delay time in response to the first bit having a second logic value different from the first logic value.

15. The delay locked loop device of claim 13, wherein the controller further comprises:
a logic circuit configured to perform logic operations based on the plurality of bits to generate a second bit indicating a time interval of the output signal being biased,
wherein controller configured to adjust the delay time according to the second bit.

16. The delay locked loop device of claim 15, wherein
the first delay line includes buffers for delaying the first clock signal to generate the output signal,
the controller is further configured to adjust a number of the buffers by a first number in response to the second bit having a first logic value, and
the controller is further configured to adjust the number of the buffers by a second number different from the first number in response to the second bit having a second logic value different from the first logic value.

17. A method, comprising:
a delay line delaying a first clock signal by a delay time to generate an output signal;
a controller delaying the output signal by a first time interval to generate a first signal;
the controller delaying the first clock signal by a second time interval being approximately an half of the first time interval to generate a second clock signal;
the controller generating a second signal based on the first signal, wherein a frequency of the second signal is equal to or lower than a half of a frequency of the first signal, and an edge of the second signal and an edge of the first signal are positioned at a same moment;
the controller delaying the first signal by the first time interval to generate a third signal; and
the controller controlling the delay line according to a voltage level of the second signal and a voltage level of the third signal at a moment of an edge of the second clock signal, to adjust the delay time.

18. The method of claim 17, wherein adjusting the delay time further comprises:
increasing the delay time in response to the voltage level of the second signal being a first voltage level; and
decreasing the delay time in response to the voltage level of the second signal being a second voltage level different from the first voltage level.

19. The method of claim 17, wherein adjusting the delay time comprises:
generating a first bit based on the voltage level of the second signal and the voltage level of the third signal, wherein the first bit indicates whether a third time interval between an edge of the output signal and an edge of the first clock signal is smaller than a fourth time interval;
adjusting the delay time by a fifth time interval in response to the third time interval being smaller than the fourth time interval; and
adjusting the delay time by a sixth time interval larger than the fifth time interval in response to the third time interval being larger than or equal to the fourth time interval.

* * * * *